(12) United States Patent
Liu

(10) Patent No.: US 8,320,173 B2
(45) Date of Patent: *Nov. 27, 2012

(54) METHODS OF FORMING PROGRAMMED MEMORY CELLS

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/463,802

(22) Filed: May 3, 2012

(65) Prior Publication Data

US 2012/0212999 A1 Aug. 23, 2012

Related U.S. Application Data

(60) Continuation of application No. 13/297,423, filed on Nov. 16, 2011, now Pat. No. 8,189,375, which is a division of application No. 12/983,757, filed on Jan. 3, 2011, now Pat. No. 8,080,817, which is a division of application No. 12/026,702, filed on Feb. 6, 2008, now Pat. No. 7,883,931.

(51) Int. Cl.
*G11C 11/00* (2006.01)
*H01L 29/76* (2006.01)

(52) U.S. Cl. ............ 365/163; 365/106; 365/145; 257/2; 257/3; 257/4; 257/5; 257/54; 257/E21.009; 257/E21.413; 257/E27.004; 257/E29.003; 257/E45.002; 438/95; 438/97; 438/102; 438/104

(58) Field of Classification Search .................. 365/106, 365/163; 257/2, 3, 4, 5, 54, E21.009, E21.413, 257/E27.004, E29.003, E45.002; 438/95, 438/97, 102, 104

See application file for complete search history.

(56) References Cited

U.S. PATENT DOCUMENTS

| 5,534,711 | A | 7/1996 | Ovshinsky et al. |
| 6,815,704 | B1 | 11/2004 | Chen |
| 6,855,975 | B2 | 2/2005 | Gilton |

(Continued)

FOREIGN PATENT DOCUMENTS

CN 200510026541.2 1/2006

(Continued)

OTHER PUBLICATIONS

Atwood, Greg, et al. "Current status of Chalcogenide phase change memory" IEEE Jul. 2005, pp. 29-33.

(Continued)

*Primary Examiner* — Dao H Nguyen
(74) *Attorney, Agent, or Firm* — Wells St. John P.S.

(57) ABSTRACT

In some embodiments, a memory cell includes a transistor gate spaced from a channel region by gate dielectric; a source region on one side of the channel region; and a drain region on an opposing side of the channel region from the source region. The channel region has phase change material adjacent the drain region. In some embodiments, the phase change material may be adjacent both the source region and the drain region. Some embodiments include methods of programming a memory cell that has phase change material adjacent a drain region. An inversion layer is formed within the channel region adjacent the gate dielectric, with the inversion layer having a pinch-off region within the phase change material adjacent the drain region. Hot carriers (for instance, electrons) within the pinch-off region are utilized to change a phase within the phase change material.

9 Claims, 20 Drawing Sheets

U.S. PATENT DOCUMENTS

| | | | |
|---|---|---|---|
| 7,005,665 | B2 | 2/2006 | Furkay et al. |
| 7,015,076 | B1 | 3/2006 | Chan et al. |
| 7,494,841 | B2 | 2/2009 | Mitzi et al. |
| 7,961,493 | B2 * | 6/2011 | Karg et al. ............ 365/145 |
| 8,189,375 | B2 * | 5/2012 | Liu ..................... 365/163 |
| 2003/0193062 | A1 * | 10/2003 | Jong et al. ............ 257/288 |
| 2005/0111252 | A1 | 5/2005 | Bednorz et al. |
| 2005/0180216 | A1 | 8/2005 | Lowrey |
| 2005/0184334 | A1 | 8/2005 | Kim et al. |
| 2006/0197082 | A1 | 9/2006 | Cho et al. |
| 2006/0211187 | A1 | 9/2006 | Choi et al. |
| 2007/0018148 | A1 | 1/2007 | Kuo et al. |
| 2007/0018202 | A1 | 1/2007 | Zhu |
| 2007/0052009 | A1 | 3/2007 | Xie et al. |
| 2007/0133358 | A1 | 6/2007 | Kubo et al. |
| 2007/0155093 | A1 | 7/2007 | Jeong et al. |
| 2007/0200202 | A1 | 8/2007 | Nowak et al. |
| 2007/0230238 | A1 | 10/2007 | Schwerin et al. |
| 2007/0252127 | A1 | 11/2007 | Arnold et al. |
| 2008/0049490 | A1 * | 2/2008 | Hosaka et al. ............ 365/163 |
| 2008/0083924 | A1 * | 4/2008 | Song et al. ............ 257/55 |
| 2008/0105861 | A1 | 5/2008 | Hosaka et al. |
| 2009/0146141 | A1 | 6/2009 | Song et al. |
| 2010/0108977 | A1 | 5/2010 | Yoon et al. |

FOREIGN PATENT DOCUMENTS

| | | |
|---|---|---|
| EP | 1 326 258 | 12/2002 |
| JP | 2003-109968 | 4/2003 |
| JP | 2003-158091 | 5/2003 |
| JP | 2003-605062 | 10/2004 |
| JP | 2006-127747 | 5/2006 |
| JP | 2006-332671 | 12/2006 |
| KR | 10-1998-48959 | 9/1998 |
| KR | 10-2004-59994 | 7/2004 |
| WO | PCT/US2009/031058 | 7/2009 |
| WO | PCT/US2009/031058 | 8/2010 |

OTHER PUBLICATIONS

Balashov, Alexander G. et al. "Non-Volatile Phase Change Memory and Its Fabrication Technology" 8th International Siberian Worshop and Tutorial EDM 2007 Session II, Jul. 1-5, ERLAGOL pp. 121-122.

Happ, T.D. et al. "Novel One-Mask Self-Heating Pillar Phase Change Memory" 2006 Symposium on VLSI Technology Digest of Technical Papers Aug. 2006 2 pages.

Hudgens, S., et al. "Overview of Phase-Change Chalcogenide Non-volatile Memory Technology" MRS Bulletin Nov. 2004 pp. 829-832.

Lam, Chung "Phase-change Memory" IEEE May 2007 pp. 223-226.

Mehra, R.M., et al. "n-type conduction in Pb doped Se—In chalcogenide glasses" Japanese Applied Physics 81 (12) Jun. 15, 1997 pp. 7842-7844.

Mikolajick, Thomas et al. "The Future of Nonvolatile Memories" http://www.leb.eei.uni-erlangen.de/wa_india/materials_wa_india2007/MAT/3_09/mikolajick_TheFutureofN.

Schrott, Alejandro "Phase-Change Memory Development Status" IEEE Aug. 2007 2 pages.

Wuttig, Matthias "Phase-Change Materials Towards a universal memory?" Nature Publishing Group vol. 4, Apr. 2005 www.nature.com/naturematerials.

Yin, You, et al. "Electrical Properties of Phase Change and Channel Current Control in Ultrathin Phase-Change Channel Transistor Memory by Annealing" Japanese Journal of Applied Physics, vol. 45, No. 46, 2006, pp. 3238-3242.

* cited by examiner

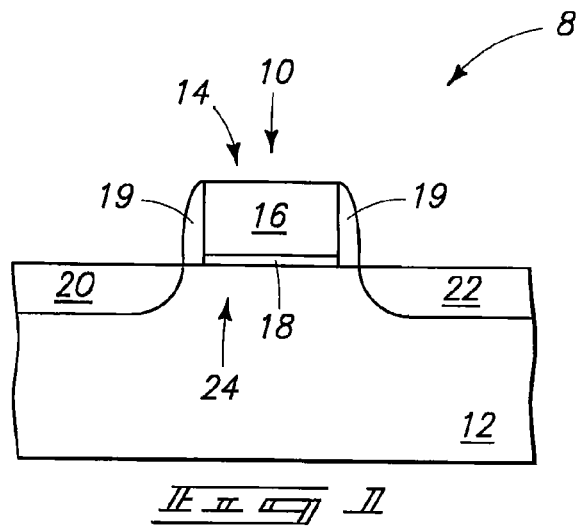
_FIG. 1_
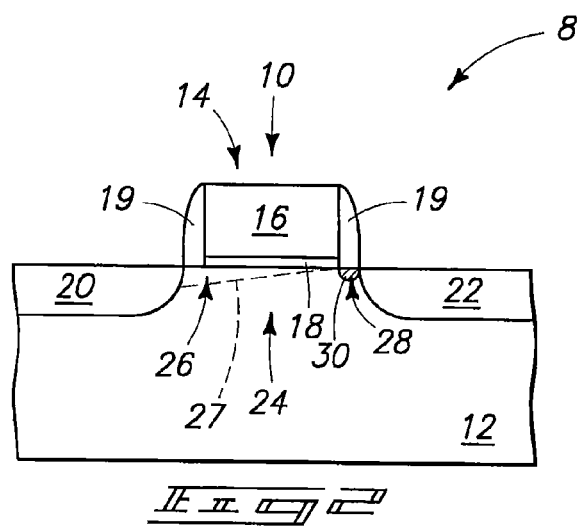
_FIG. 2_
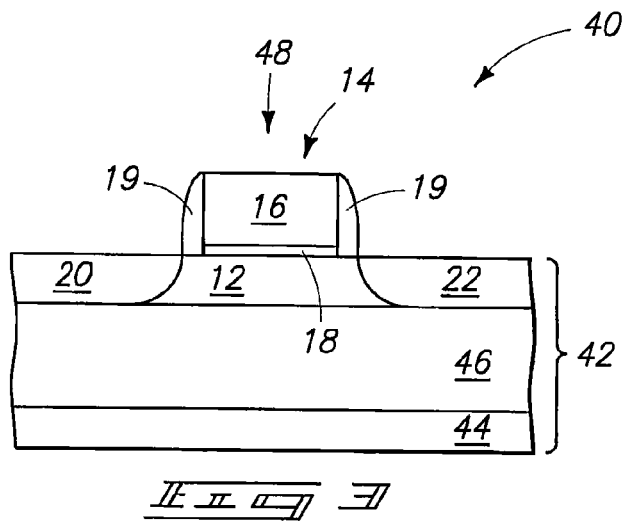
_FIG. 3_

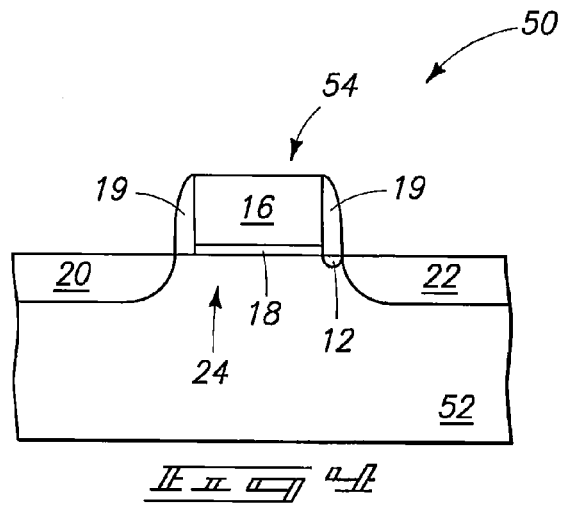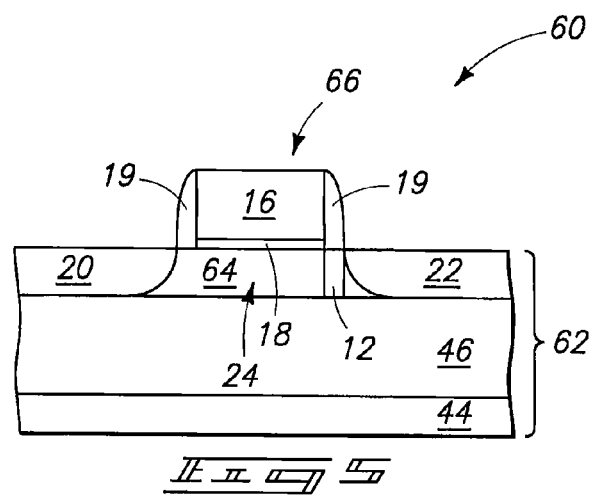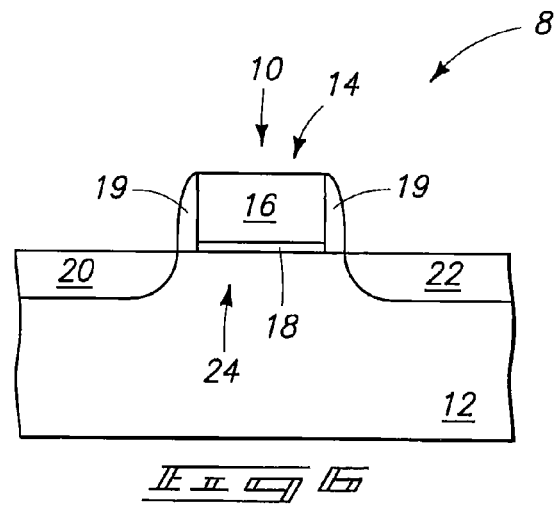

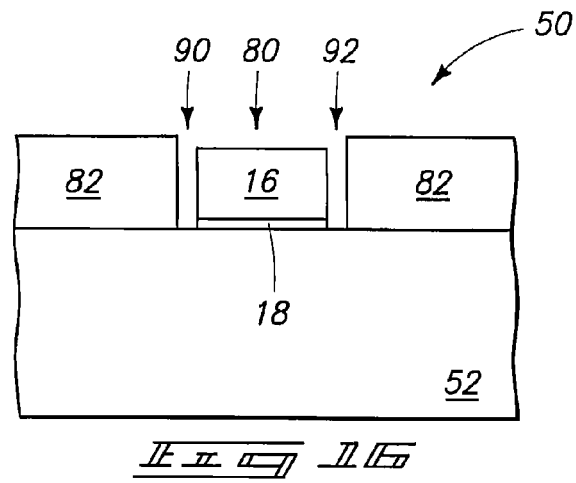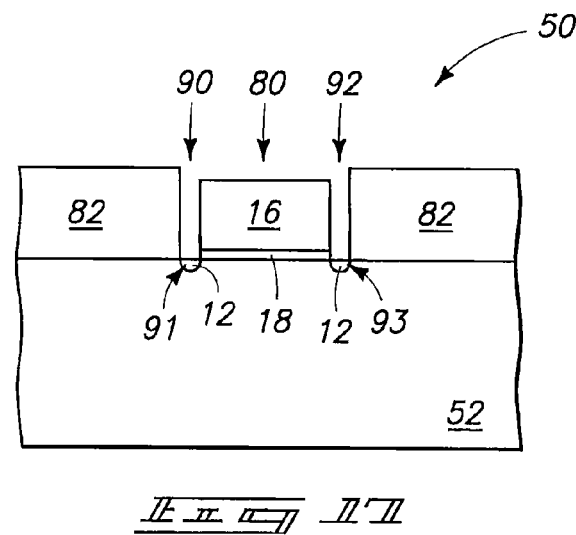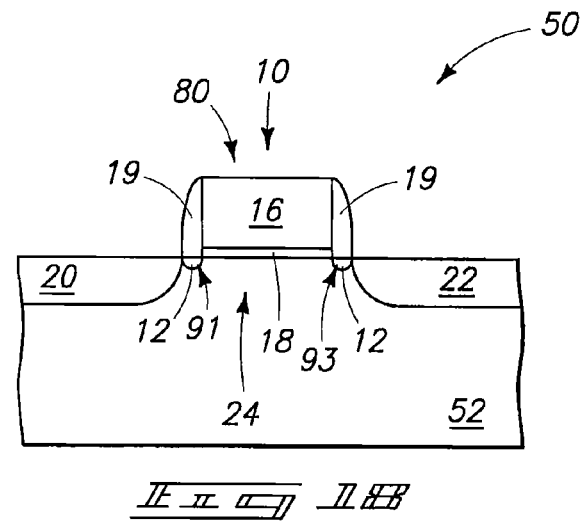

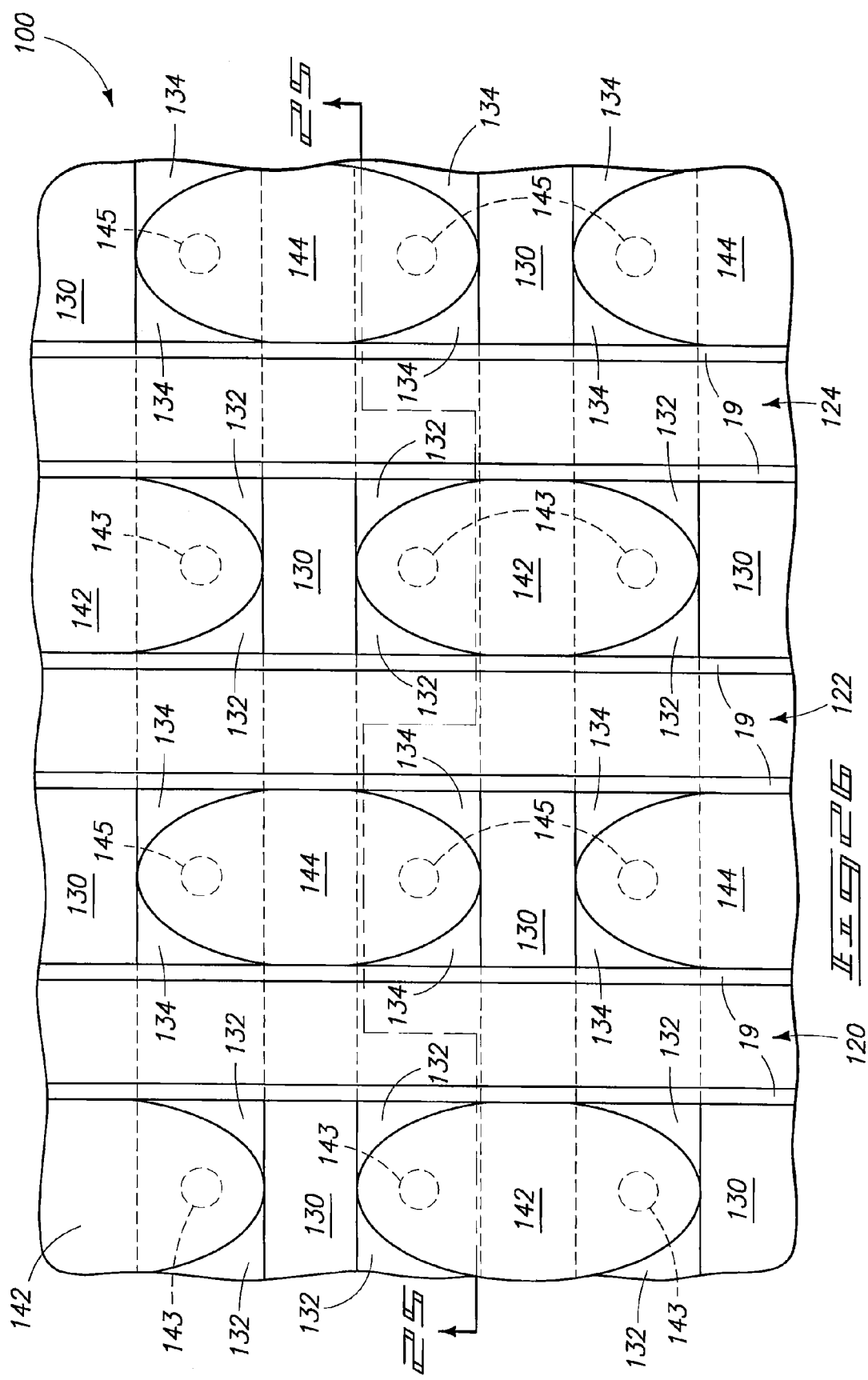

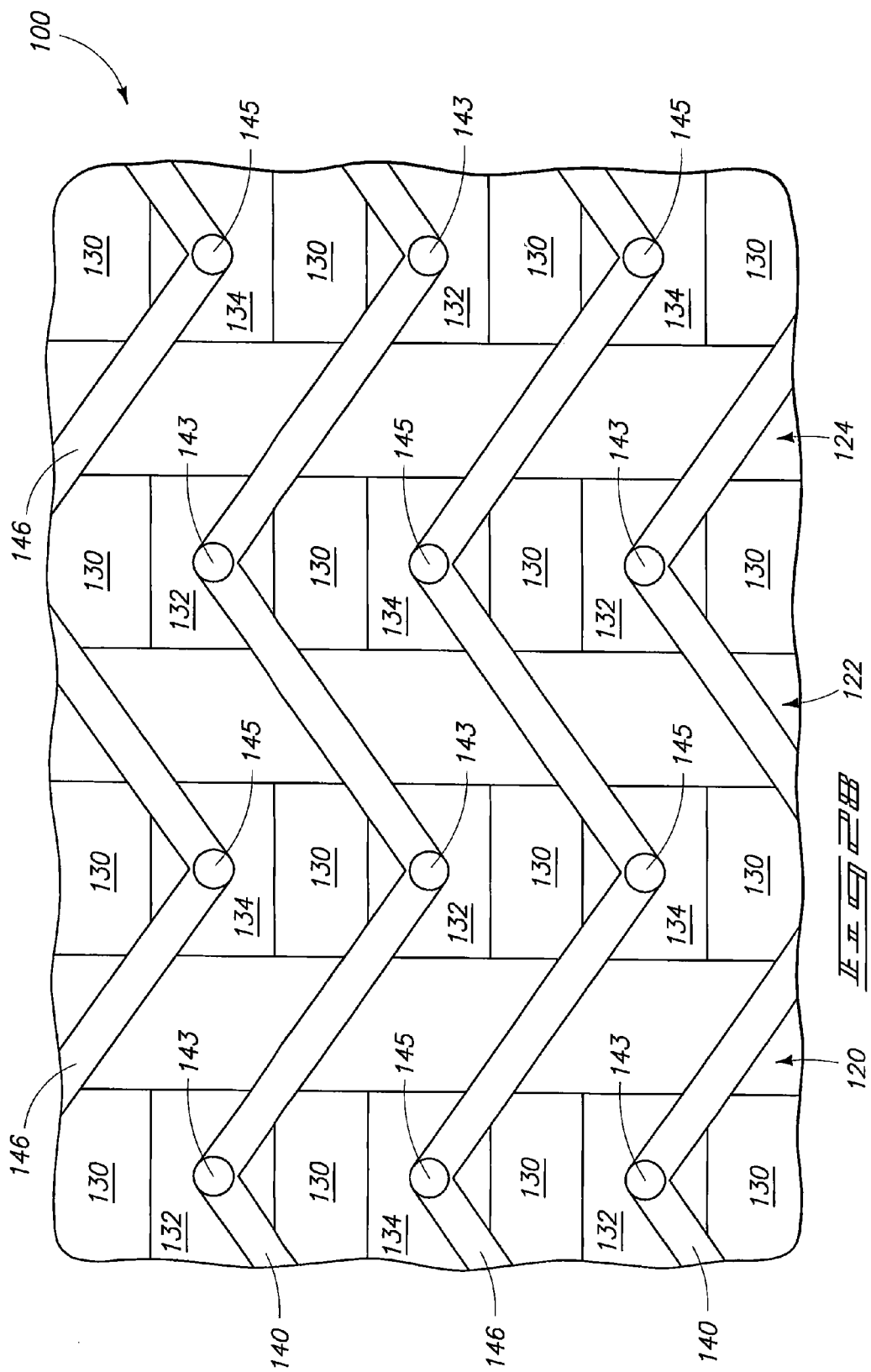

METHODS OF FORMING PROGRAMMED MEMORY CELLS

RELATED PATENT DATA

This patent resulted from a continuation of U.S. patent application Ser. No. 13/297,423, which was filed Nov. 16, 2011, which issued as U.S. Pat. No. 8,189,375, and which is hereby incorporated herein by reference; which resulted from a divisional of U.S. patent application Ser. No. 12/983,757, which was filed Jan. 3, 2011, which issued as U.S. Pat. No. 8,080,817, and which is hereby incorporated herein by reference; which resulted from a divisional of U.S. patent application Ser. No. 12/026,702, which was filed Feb. 6, 2008, which is now U.S. Pat. No. 7,883,931, and which is hereby incorporated herein by reference.

TECHNICAL FIELD

Memory cells, methods of forming memory cells, and methods of forming programmed memory cells.

BACKGROUND

Semiconductor devices are commonly utilized for data storage and processing. The data storage may utilize an array of memory devices. Some memory devices are particularly well-suited for long-term storage of data, while others are better suited for rapid reading and writing (in other words, rapid access).

Among the memory devices that are particularly well-suited for rapid access are dynamic random access memory (DRAM) devices. A traditional DRAM unit cell may include a transistor in combination with a capacitor. Voltage stored in the capacitor represents digital bits of information.

The capacitors of the DRAM devices leak stored charge. Accordingly, electric power is supplied to the capacitors in frequent refresh cycles to avoid dissipation of stored charge, and consequent loss of information. Memory devices that utilize frequent refresh are often referred to as volatile memory devices.

Another type of memory device is a so-called nonvolatile memory device. Nonvolatile memory devices do not need frequent refresh cycles to preserve stored information. Accordingly, nonvolatile memory devices may consume less power than volatile memory devices; and, unlike volatile memory devices, may operate in environments where power is not always on. Among the applications in which nonvolatile memory devices may provide particular advantages are mobile device applications where power is supplied by batteries (for instance, cell phones, laptops, etc.), and/or and applications where power may be turned off during retention of data (for instance, control systems of automobiles, military devices, etc.).

An advantage of conventional DRAM devices is the speed with which data may be written to and read from the memory devices. It would be desirable to develop a nonvolatile memory device which may be accessed with speeds approaching, or even exceeding, the speeds of conventional DRAM devices.

A continuing goal of semiconductor fabrication is to reduce the amount of semiconductor real estate consumed by various components, to thereby increase integration. It would be desirable to develop memory devices which may be highly integrated, and which may be readily vertically stacked in order to conserve semiconductor real estate.

Phase change materials are a class of materials that change phase upon being exposed to thermal and/or other conditions. Phase change materials may be utilized in memory devices as data storage elements. Specifically, when the phase change materials are in one phase they may be considered to correspond to one binary digit (i.e., either a "0" or a "1"), and when in another phase they may be considered to correspond to the other binary digit. Thus, phase change materials may be utilized to store a data bit. It would be desired to develop improved methods for incorporating phase change materials into memory devices, and to develop improved devices that utilize phase change materials.

BRIEF DESCRIPTION OF THE DRAWINGS

FIG. 1 is a diagrammatic, cross-sectional view of a portion of a semiconductor construction illustrating an embodiment of a memory device.

FIG. 2 is a view of the memory device of FIG. 1 shown during a programming operation.

FIG. 3 is a diagrammatic, cross-sectional view of a portion of a semiconductor construction illustrating another embodiment of a memory device.

FIG. 4 is a diagrammatic, cross-sectional view of a portion of a semiconductor construction illustrating another embodiment of a memory device.

FIG. 5 is a diagrammatic, cross-sectional view of a portion of a semiconductor construction illustrating another embodiment of a memory device.

FIGS. 6-9 illustrate various programming stages for an embodiment of a memory device.

FIGS. 16-18 illustrate various processing stages for forming an embodiment of a memory device.

FIG. 23 is along the line 23-23 of FIG. 24.

FIGS. 25 and 26 illustrate the portion of the memory array of FIGS. 23 and 24 at a processing stage subsequent to that of FIGS. 23 and 24. FIG. 25 is along the line 25-25 of FIG. 26, and FIG. 26 is along the line 26-26 of FIG. 25.

FIGS. 27-29 illustrate plan views for forming contacts to source and drain regions of memory cells in accordance with example embodiments.

DETAILED DESCRIPTION OF THE ILLUSTRATED EMBODIMENTS

Figure 7:
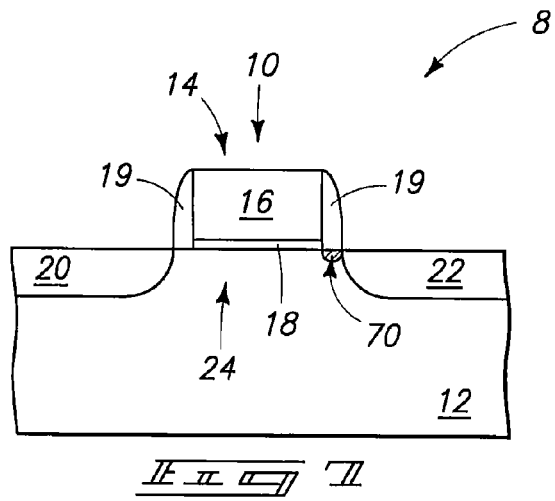

In some embodiments, hot electron injection and impact ionization near drain regions are utilized to create localized heating, which in turn is utilized to induce a phase change in phase change material. The phase change material may be any suitable material, including, for example, one or more of GeTe, InSe, SbTe, GaSb, InSb, AsTe, AlTe, GeSbTe, TeGeAs, InSbTe, TeSnSe, GeSeGa, BiSeSb, GaSeTe, SnSbTe, InSbGe, TeGeSbS, TeGeSnO, TeGeSnAu, PdTeGeSn, InSeTiCo, GeSbTePd, GeSbTeCo, SbTeBiSe, AgInSbTe, GeSbSeTe, GeSnSbTe, GeTeSnNi, GeTeSnPd, and GeTeSnPt; with such materials being described in terms of chemical constituents instead of particular stoichiometries. Example stoichiometries are $Ge_2Sb_2Te_5$ (which is a material commonly referred to as GST), and $Sb_2Te_3$.

The localized heating can take advantage of a phenomenon called hot carrier injection, which is often considered a problem in the prior art. When voltage is applied to a field effect transistor (FET), an inversion layer is created across the channel region of the transistor to enable current flow between the source and drain. If excess voltage is applied to the drain of the transistor, a region of the inversion layer adjacent the drain will be deprived of minority carriers. Hot carrier injection into such region may occur, creating electron-hole pairs due to impact ionization.

If the source and drain regions are n-type majority doped (i.e., if the FET is an NMOS device), the hot carriers will be electrons. If the channel region consists of material having high thermal conductivity, the heat generated by hot electrons may be dispersed to alleviate a self-heating effect. This is a perceived advantage of bulk silicon in the prior art. The bulk silicon has a relatively high thermal conductivity throughout, and accordingly can disperse heat generated by hot electrons. The self-heating may lead to thermally-induced problems, however, with the thin silicon layer utilized in silicon-on-insulator constructions.

Phase change materials tend to have relatively poor thermal conductivity as compared to silicon, germanium and other semiconductor materials conventionally utilized in transistor channel regions. In some embodiments, this relatively poor thermal conductivity is taken advantage of to induce localized self-heating and thereby heat a region proximate the drain of an FET. The localized self-heating is created through hot carrier injection and impact ionization. The localized self-heating is utilized to enhance phase change within the phase change material to assist in changing the material between crystalline and amorphous states during programming of a memory cell (for instance, a phase change random access memory (PCRAM)). In some embodiments, the localized self-heating created through hot carrier injection and impact ionization may be utilized in the absence of additional heating to induce a desired phase change; and the PCRAM may thus be considered a self-heating device. In some example embodiments, the localized self-heating may be utilized to induce a phase change in a PCRAM while the PCRAM is at about room temperature (about 22° C.).

Several embodiments of phase-change-material-containing memory cells are described below. Some of the embodiments may be considered nonvolatile devices, and yet may be read as fast as DRAM, and in some applications may be written to as fast a DRAM.

The specific example embodiments discussed below utilize n-type source/drain regions and a p-type channel, and accordingly it is electrons that are injected near the drain. It is noted, however, that in other embodiments it can be p-type source/drain regions, and an n-type channel, and then it will be holes that are injected. However, hole injection may be undesirably much slower than electron injection.

An example embodiment is described with reference to FIGS. 1 and 2.

Referring to FIG. 1, a semiconductor construction 8 includes a substrate 12 supporting a memory cell 10. The memory cell contains a FET 14.

The substrate may consist of one or more of the phase change materials discussed above, and in some embodiments may consist of GST doped with p-type dopant.

The FET 14 comprises a transistor gate 16 over a gate dielectric 18, and comprises electrically insulative spacers 19 along the opposing sidewalls of the transistor gate. The FET further comprises a source region 20 adjacent one side of the transistor gate, and a drain region 22 adjacent an opposing side of the transistor gate from source region.

The transistor gate 16 may comprise one or more electrically conductive compositions, and may, for example, comprise one or more of metal (for instance, tungsten, titanium, etc.), metal-containing compositions (for instance, metal silicide, metal nitride, etc.), and conductively-doped semiconductor materials (for instance, conductively-doped silicon, germanium, etc.); and may comprise an electrically insulative cap over the conductive material.

The gate dielectric 18 may comprise one or more electrically insulative compositions; and may, for example, comprise silicon dioxide and/or any of various high-k compositions (with high-k compositions being compositions having a dielectric constant greater than that of silicon dioxide).

The sidewall spacers 19 may comprise one or more electrically insulative compositions; and may, for example, comprise one or more of silicon dioxide, silicon nitride, and silicon oxynitride.

The source/drain regions 20 and 22 may correspond to regions were dopant is implanted into substrate 12. Alternatively, the source/drain regions may correspond to Schottky junctions where metal is formed along an upper surface of the substrate, or within recesses extending into the substrate.

If the source and drain regions are implant regions, the implant regions may be either majority n-type doped or majority p-type doped. However, for the reasons discussed above, it may be advantageous for the implant regions to be majority n-type doped so that hot electron injection is utilized instead of hot hole injection. The source and drain regions may extend to any suitable depth within substrate 12; and may, for example, extend to a depth of from about 10 nanometers (nm) to about 200 nm. If the source and drain regions are formed by implanting n-type dopant into phase change material, the dopant may correspond to, for example, one or both of Bi and Pb.

A channel region 24 is under gate dielectric 18, and extends between source region 20 and drain region 22. The channel region may be doped with a threshold voltage dopant.

Referring to FIG. 2, construction 8 is illustrated at a stage in which voltage is applied to gate 16 and drain 22. Such creates an inversion layer 26 within channel 24; with a boundary of the inversion layer being diagrammatically illustrated by a dashed line 27. The inversion layer is shaped as a wedge, and specifically is thicker near source 20 than near drain 22. The inversion layer may have a maximum thickness (i.e., depth under the gate dielectric) of a few nanometers. In the shown embodiment, the inversion layer becomes so thin proximate drain 22 that a pinch-off region 28 (i.e., a region where carriers are depleted) is formed proximate the drain.

Hot carrier injection and impact ionization (specifically injection of hot electrons in the shown embodiment) occurs within the pinch-off region to increase a temperature of phase change material 12 within the pinch-off region. The increased temperature of phase change material 12 within the pinch-off region creates a region 30 of the phase change material that has a different phase than the remainder of the phase change material within the channel region. Region 30 is illustrated with cross-hatching to diagrammatically distinguish region 30 from the remainder of phase change material 12. Such cross-hatching is not utilized to indicate a particular phase within region 30 relative to the remainder of phase change material 12.

The phase change material of region 30 is utilized as a programmable volume of memory cell 8. Specifically, if region 30 is in an amorphous phase, it impedes current flow through channel region 24 relative to when region 30 is in a crystalline phase. When the programmable volume is in an amorphous phase, the memory cell corresponds to one memory state (for instance, the state designated as "0" of a data bit), and when the programmable volume is in a crystalline phase, the memory cell corresponds to a different memory state (for instance, the state designated as "1" of the data bit).

The particular phase created within region 30 may be controlled by controlling the temperature within region 30, and the time that region 30 is exposed to such temperature. For instance, if region 30 is exposed to a temperature above the effective melting temperature, the region will become amorphous if it is exposed for sufficient time (which may be 10 nanoseconds in some embodiments), and quenched quickly to room temperature with sufficient cooling rate. If region 30 is exposed to a temperature that is above the crystallization temperature and below the effective melting temperature, the region will become crystalline if it is exposed for sufficient time (which may be about 30 nanoseconds in some embodiments). An advantage of programming the phase change material may be that if the exposure time is too long, there will not be a change to an undesired memory state. Rather, the memory states may correspond to equilibriums that, once reached, will be maintained as long as the temperature remains within an appropriate regime.

The temperature that region 30 is exposed to may be correlated to voltages applied at the source, gate and drain of FET 14, and accordingly memory cell 8 may be programmed to a desired memory state through application of appropriate voltages to the various components of the FET.

Example programming that may be used in some embodiments is as follows.

To program a localized amorphous region (i.e., to RESET a PCRAM to state "0") the following voltages may be applied: if a threshold voltage ($V_t$) of 0.5 volts; then a gate voltage ($V_g$) of 1 volt, a drain voltage ($V_d$) of 2.5 volts, and a source voltage ($V_s$) of 0 volt.

The voltage conditions of the RESET may be maintained for a duration of at least about 10 nanoseconds to fully convert a programmable volume of phase change material to an amorphous state.

To program an amorphous region to a crystalline region (i.e., to SET a PCRAM to state "1") the following voltages may be applied: if a threshold voltage ($V_t$) of 0.5 volts; then a gate voltage ($V_g$) of 1 volt, a drain voltage ($V_d$) of 1.8 volts, and a source voltage ($V_s$) of 0 volt.

The voltage conditions of the SET may be maintained for a duration of at least about 30 nanoseconds (in some embodiments, the duration may be from about 30 nanoseconds to about 100 nanoseconds) to fully convert a programmable volume of phase change material from an amorphous state to a crystalline state.

To read the PCRAM and ascertain if the programmable volume is an amorphous state or a crystalline state (i.e., to determine if the PCRAM is in the SET or RESET state), the following voltages may be applied: if a threshold voltage ($V_t$) of 0.5 volts; then a gate voltage ($V_g$) of 0.8 volts, a drain voltage ($V_d$) of 0.2 volts, and a source voltage ($V_s$) of 0 volt.

The RESET state will have lower current flow through the channel than the SET state during the reading of the PCRAM due to the amorphous region of the phase change material impeding current flow more than the crystalline state of the phase change material.

FIGS. 1 and 2 illustrate one example of a memory cell comprising phase change material proximate the drain region of a FET. FIGS. 3-5 illustrate three more examples of memory cells comprising phase change material proximate the drain region of a FET. In referring to FIGS. 3-5, similar numbering is used as was utilized to describe FIGS. 1 and 2, where appropriate.

Referring to FIG. 3, a semiconductor construction 40 comprises a substrate 42 analogous to a semiconductor-on-insulator construction. Specifically, substrate 42 comprises a base 44 supporting an insulator 46 (specifically, an electrically insulative material), and comprises phase change material 12 over the insulator. Base 44 may correspond to, for example, a monocrystalline silicon wafer. Insulator 46 may, for example, comprise, consist essentially of, or consist of silicon dioxide. The phase change material 12 may comprise any of the compositions discussed above.

A memory cell 48 is supported by phase change material 12. The memory cell comprises a FET 14 containing the gate 16, dielectric material 18, spacers 19, source 20 and drain 22 discussed above. In the shown embodiment, the source 20 and drain 22 extend entirely across phase change material 12 to reach insulator 46. In other embodiments, the source and drain may extend only partially across the thickness of phase change material 12.

The memory cell 48 may be operated similarly to the memory cell 10 discussed above with reference to FIGS. 1 and 2.

The memory cells of FIGS. 1-3 have phase change material extending throughout an entirety of a channel region. In other embodiments, hybrid constructions may be formed in which a portion of a channel region comprises traditional semiconductor materials (i.e., non-phase change materials; such as silicon, germanium, etc. in non-phase change form), and another portion of the channel region comprises phase change material. The portion comprising traditional semiconductor material may be all of the channel region except for a segment where a pinch-off region will form proximate the drain.

An example hybrid construction is shown in FIG. 4. Specifically, FIG. 4 shows a construction 50 that comprises a base 52 having a volume of phase change material 12 extending therein. The base 52 may, for example, comprise, consist essentially of or consist of non-phase change semiconductor material (for instance, bulk monocrystalline silicon). The phase change material 12 may comprise any of the phase change material compositions discussed above.

A memory cell 54 is supported by base 52. Memory cell 54 comprises a FET 14 containing the gate 16, dielectric material 18, spacers 19, source region 20 and drain region 22 discussed above; and comprises at least some of the phase change material 12 within the channel region 24. In the shown embodiment, the channel region 24 primarily comprises non-phase change semiconductor material of base 52 (i.e., comprises more than 50% non-phase change semiconductor material, by volume) and comprises the phase change material only adjacent the drain region 22. In some embodiments, the channel may have a length from the source region to the drain region of from about 15 nm to about 100 nm, and the phase change material 12 may be contained within a region having a length within the channel region of from about 5 nm to about 30 nm.

The memory cell 54 may be operated similarly to the memory cell 10 discussed above with reference to FIGS. 1 and 2.

Another example hybrid construction is shown in FIG. 5. FIG. 5 illustrates a construction 60 that comprises a substrate 62 analogous to the substrate 42 discussed above with reference to FIG. 3. Specifically, substrate 62 comprises the base 44 supporting an insulator 46. However, in contrast to FIG. 3, the substrate 62 comprises a layer of traditional semiconductor material (for instance, Si or Ge) 64 over insulator 46, and comprises phase change material 12 only within a small region of material 64.

A memory cell 66 is supported by base 62. Memory cell 66 comprises a FET 14 containing the gate 16, dielectric material 18, spacers 19, source region 20 and drain region 22 discussed above; and comprises at least some of the phase change material 12 within the channel region 24 extending between the source and drain regions. In the shown embodiment, the source region 20 and drain region 22 extend entirely across semiconductor material 64 to reach insulator 46. In other embodiments, the source and drain regions may extend only partially across the thickness of semiconductor material 64. In the shown embodiment, the channel region 24 primarily comprises non-phase change semiconductor material of layer 64, and comprises the phase change material 12 only adjacent the drain region 22 (with the material 12 being directly adjacent the drain region—i.e., touching the drain region—in the shown embodiment).

The memory cell 66 may be operated similarly to the memory cell 10 discussed above with reference to FIGS. 1 and 2.

The memory cells of FIGS. 1-5 are described as being configured to store a single data bit. Specifically, the memory cells comprise a single programmable volume of phase change material proximate a FET drain, and utilize two interchangeable states of the phase change material to store a data bit. In other embodiments, a memory cell may be configured to comprise two programmable volumes of phase change material within a single FET. Furthermore, the orientation of the regions 20 and 22 of FIGS. 1-5 as a source and drain, respectively, may be reversed by changing a direction of current flow through such regions. FIGS. 6-9 illustrate a method of utilizing the construction 8 of FIGS. 1 and 2 to store more than just one of two memory states (and specifically to store one of four memory states, or in other words two data bits). In referring to FIGS. 6-9, similar numbering will be used as is used above to describe FIGS. 1 and 2, where appropriate. An exception is that regions 20 and 22 will be referred to as source/drain regions, rather than as a source and a drain, to indicate that the status of the individual regions as either a source or a drain will change during programming of the memory cell. The status of the individual source/drain regions as either a source or a drain may also change during reading of information from the memory cell.

FIG. 6 shows construction 8 at a programming stage in which phase change material 12 has a single homogeneous crystalline phase across an entirety of channel region 24. Such crystalline phase may be, for example, a low resistivity polycrystalline phase (as opposed to a high resistivity amorphous phase), and accordingly high current will flow across the channel region during reading of the FET regardless of whether source/drain region 20 is the source or the drain of the FET. The programming state of FIG. 6 may be considered a [1, 1] programming state of the memory cell.

FIG. 7 shows construction 8 after the construction is subjected to programming voltage which converts a region 70 of the phase change material proximate source/drain region 22 into an amorphous phase (diagrammatically illustrated with cross-hatching in FIG. 7). The programming may be conducted by utilizing source/drain region 22 as a drain to create localized self heating through hot carrier injection and impact ionization proximate source/drain region 22. Amorphous region 70 will impede current flow across channel 24 during reading. The influence of amorphous region 70 on current flow during the reading will be more pronounced when region 22 is a source than when region 22 is a drain. Accordingly, when region 20 is a source and region 22 is a drain, there will be relatively high current flow through channel 24; and when region 22 is a source and region 20 is a drain there will be relatively low current flow through channel 24. The programming state of FIG. 7 may be considered a [1, 0] programming state of the memory cell. The region 70 may be considered to be a first volume of programmable material.

Figure 8:
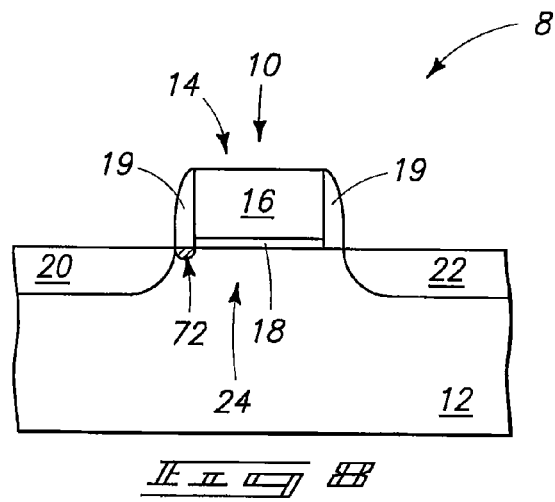

FIG. 8 shows construction 8 after the construction is subjected to programming voltage which converts a region 72 of the phase change material proximate source/drain region 20 into an amorphous phase. The programming may be conducted by utilizing source/drain region 20 as a drain to create localized self heating through hot carrier injection and impact ionization proximate source/drain region 20. Amorphous region 72 will impede current flow across channel 24 during reading. The influence of amorphous region 72 on current flow during the reading will be more pronounced when region 20 is a source than when region 20 is a drain. Accordingly, when region 20 is a source and region 22 is a drain, there will be relatively low current flow through channel 24; and when region 22 is a source and region 20 is a drain there will be relatively high current flow through channel 24. The programming state of FIG. 7 may be considered a [0, 1] programming state of the memory cell. The region 72 may be considered to be a second volume of programmable material.

Figure 9:
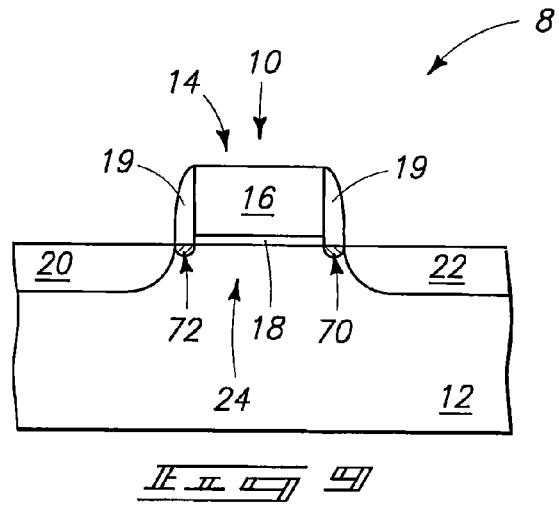

FIG. 9 shows construction 8 after the construction is subjected to programming voltages which convert both of regions 70 and 72 of the phase change material into amorphous phases. The programming may be conducted by following the programming state of FIG. 7 with programming suitable to form region 72 of FIG. 8; or by following the programming state of FIG. 8 with programming suitable to form region 70 of FIG. 7. Amorphous regions 70 and 72 will impede current flow across channel 24 during reading, regardless of which of source/drain regions 70 and 72 is a source and which is a drain. The programming state of FIG. 9 may be considered a [0, 0] programming state of the memory cell. The reading uses a smaller gate voltage and thus will be significantly affected by the state of the programmable volume, whereas the programming uses a much larger gate voltage which may fully invert the programmable volume and may minimize the effect of the state of the programmable volume.

Example programming that may be used in some embodiments to program a dual-bit (i.e., four-state) device of the type described in FIGS. 6-9 is as follows.

To program a localized amorphous region (i.e., to RESET) the following voltages may be applied: if a threshold voltage ($V_t$) of 0.5 volts; then a gate voltage ($V_g$) of 2 volts, a drain voltage ($V_d$) of 3 volts, and a source voltage ($V_s$) of 0 volt.

To program an amorphous region to a crystalline region (i.e., to SET) the following voltages may be applied: if a threshold voltage ($V_t$) of 0.5 volts; then a gate voltage ($V_g$) of 2 volts, a drain voltage ($V_d$) of 2.4 volts, and a source voltage ($V_s$) of 0 volt.

To read the PCRAM the following voltages may be applied: if a threshold voltage ($V_t$) of 0.5 volts; then a gate voltage ($V_g$) of 0.8 volts, a drain voltage ($V_d$) of 0.6 volts, and a source voltage ($V_s$) of 0 volt.

In some embodiments, the reading of one bit of the two-bit PCRAM may be almost independent of the reading of the other bit of the two-bit PCRAM due to the pinch-off effect.

Any suitable processing method may be utilized to form memory cells of the various embodiments. An example method which may be utilized to form the memory cell of FIG. 4 is described with reference to FIGS. 10-15. Similar numbering will be utilized to describe FIGS. 10-15 as is used above to describe FIG. 4, where appropriate.

Figure 10:
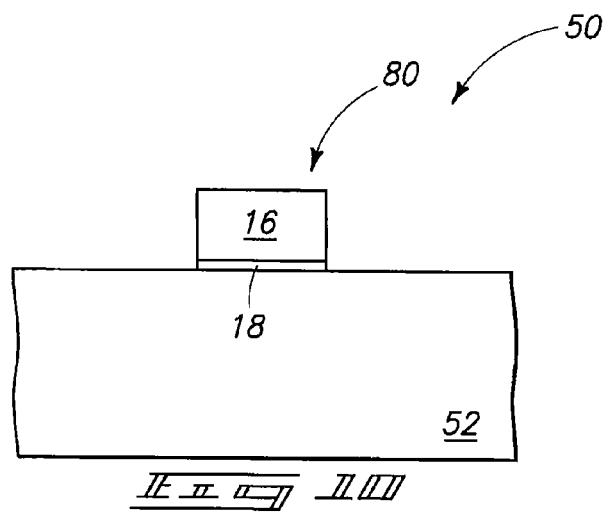
FIGS. 10-15 illustrate various processing stages for forming an embodiment of a memory device.

Referring to FIG. 10, construction 50 is shown at a processing stage prior to that of FIG. 4. A patterned gate stack 80 is formed over a semiconductor base 52. The patterned gate stack comprises gate material 16 over gate dielectric 18, and may correspond to a line extending into and out of the page relative to the shown cross-sectional view.

Figure 11:
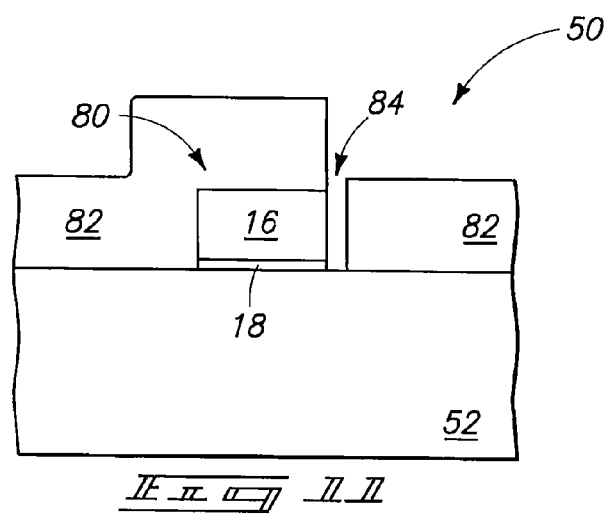

Referring to FIG. 11, masking material 82 is formed across base 52 and over gate stack 80. Masking material 82 may comprise any suitable composition, and may, for example, comprise, consist essentially of or consist of photolithographically-patterned photoresist.

Patterned masking material 82 defines an opening 84 that extends through the patterned masking material and to an upper surface of base 52.

Figure 12:
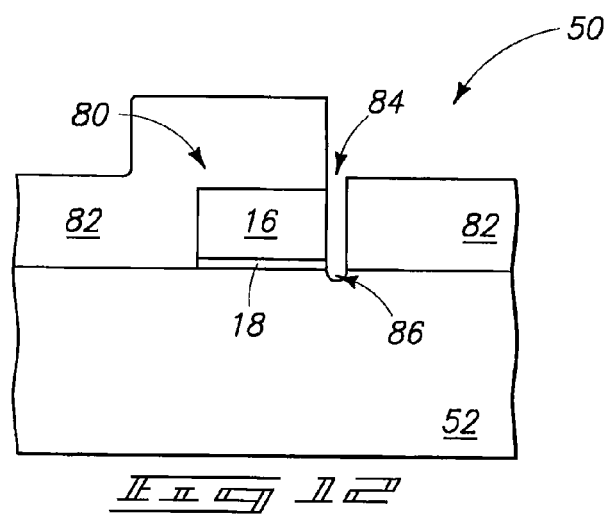

Referring to FIG. 12, opening 84 is extended into base 52 to form a recess 86 within a region of base 52.

Figure 13:
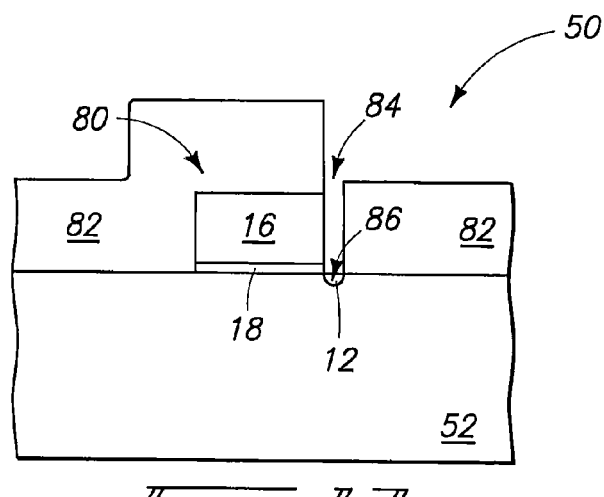

Referring to FIG. 13, phase change material 12 is deposited within the recess. In the shown embodiment, the phase change material fills the recess. The phase change material may be provided to a sufficient amount to fill the recess by utilizing a timed deposition of the phase change material. Alternatively, the phase change material may provided to an amount that overfills the recess, and then excess phase change material may be removed with an etch.

Figure 14:
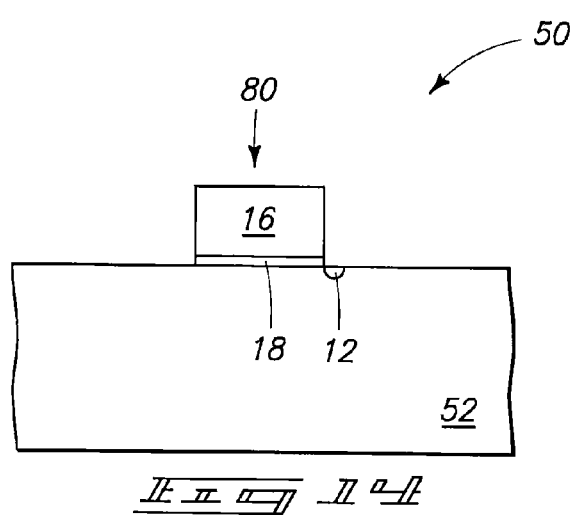

Referring to FIG. 14, masking material 82 (FIG. 13) is removed. If the amount of phase change material formed within the recess overfills the recess, the excess phase change material may be removed with an etch occurring before or after removal of the masking material 82.

Figure 15:
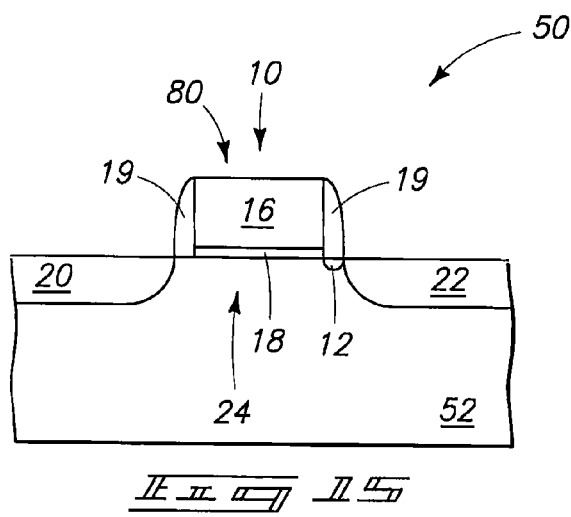

Referring to FIG. 15, spacers 19 are formed along opposing sidewalls of gate stack 80. The spacers may be formed by depositing a layer of spacer material over base 52 and across the line 80, and then anisotropically etching the spacer material. The spacers 19 and gateline 80 are used as a mask during implant of dopant into base 52, with the implanted dopant forming source/drain regions 20 and 22.

The gateline 80 comprises a transistor gate of a FET 10. The FET includes a channel region 24 extending between source/drain regions 20 and 22, with such channel region extending across a single segment of phase change material 12. Thus, the memory cell of FIG. 15 is configured to store one of two states, (i.e., to store a single bit).

Another example method which may be utilized to form the memory cell of FIG. 4 is described with reference to FIGS. 35-39. Similar numbering will be utilized to describe FIGS. 35-39 as is used above to describe FIGS. 4 and 10-15, where appropriate.

Figure 35:
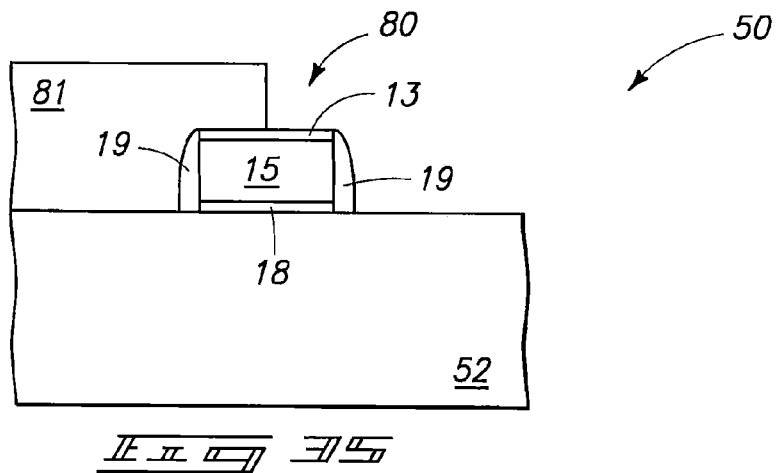
FIGS. 35-39 illustrate various processing stages for forming an embodiment of a memory device.

Referring to FIG. 35, construction 50 is shown at a processing stage prior to that of FIG. 4. A patterned gate stack 80 is formed over a semiconductor base 52. The patterned gate stack comprises materials 13 and 15 over gate dielectric 18, and may correspond to a line extending into and out of the page relative to the shown cross-sectional view. The material 13 may correspond to an insulative cap (for instance, a cap comprising silicon nitride), and the material 15 may correspond to one or more electrically conductive materials.

A pair of sidewall spacers 19 are along the opposing sidewalls of the gate stack.

A sacrificial material 81 is formed to protect a portion of base 52 and to extend partially across gate stack 80.

Figure 36:
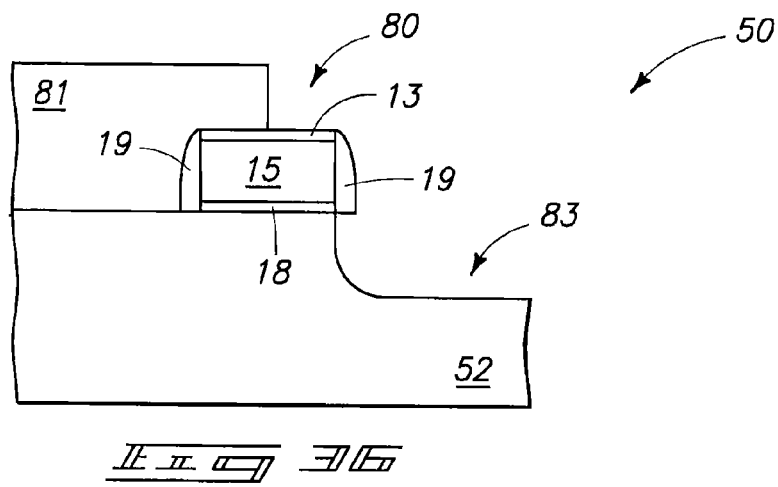

Referring to FIG. 36, construction 50 is exposed to an etch which selectively removes material of base 52 relative to material of spacers 19 and relative to material 13. In some embodiments, base 52 consists of, or consists essentially of, silicon; while spacers 19 and material 13 consist essentially of, or consist of, silicon nitride. The etch forms an opening 83 extending into base 52. The etch undercuts one of the spacers 19 so that the opening 83 extends under such spacer. Although the opening 83 appears to leave the right spacer 19 unsupported in the cross-sectional view of FIG. 36, the spacer would extend beyond the opening in a direction orthogonal to the cross-section of FIG. 36 (i.e., a direction extending into and out of the page) so that some of the spacer remains supported by base 52.

Figure 37:
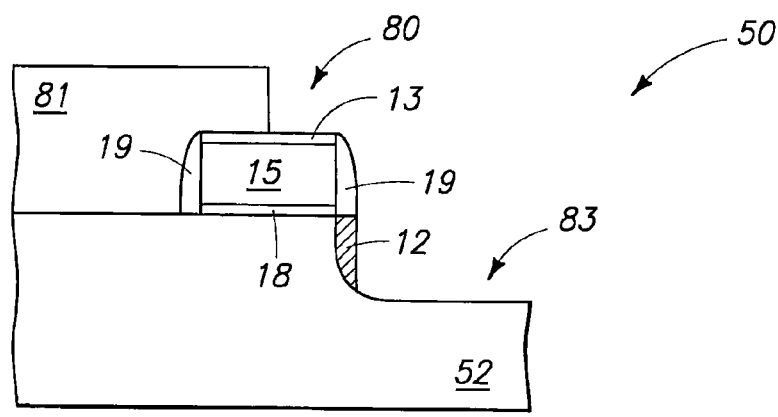

Referring to FIG. 37, phase change material 12 is deposited within opening 83, and then anisotropically etched so that the phase change material remains only under the right spacer 19 in the shown view.

Figure 38:
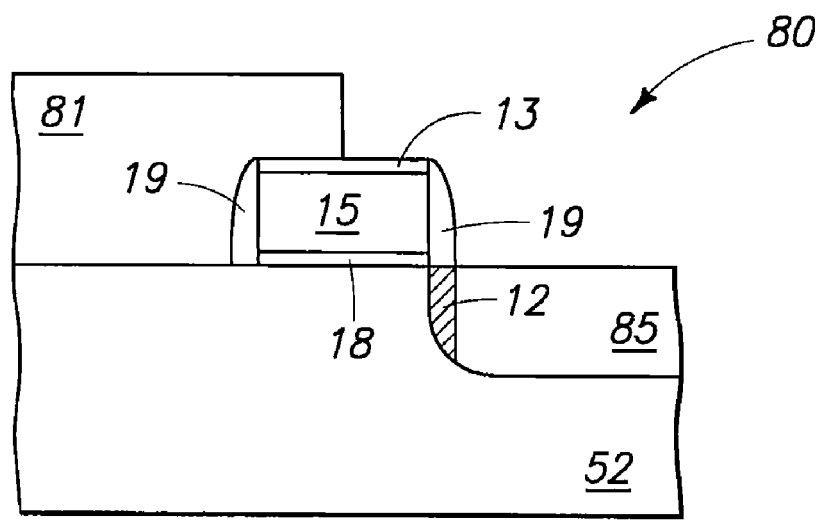

Referring to FIG. 38, semiconductor material 85 is epitaxially grown within opening 83 to fill the opening. The epitaxially-grown semiconductor may, for example, comprise, consist essentially of, or consist of monocrystalline silicon.

Figure 39:
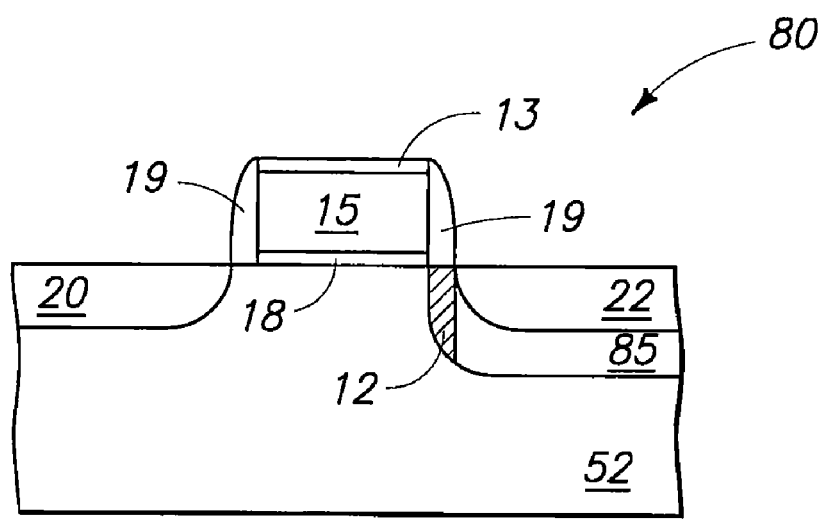

Referring to FIG. 39 dopant is implanted into base 52 and epitaxially grown material 85 to form source/drain regions 20 and 22.

Similar processing to that of FIGS. 10-15, or FIGS. 35-39, may be utilized to form a memory cell analogous to that of FIGS. 6-9, and configured to store, for example, two bits of information. An example process which may be utilized to form a memory cell configured to store two bits of information is described with reference to FIGS. 16-18. In referring to FIGS. 16-18, similar numbering will be used as is used to describe FIGS. 10-15, where appropriate.

FIG. 16 shows the construction 50 of FIG. 10 at a processing stage analogous to that of FIG. 11. The patterned masking material 82 has been formed at the processing stage of FIG. 16. However, in contrast to the embodiment of FIG. 11, the patterned masking material has two openings 90 and 92 extending therethrough, rather than the single opening 84 of FIG. 11; and the patterned masking material is not over the line 80 (although it could be over the line 80 in other embodiments).

Figure 17:
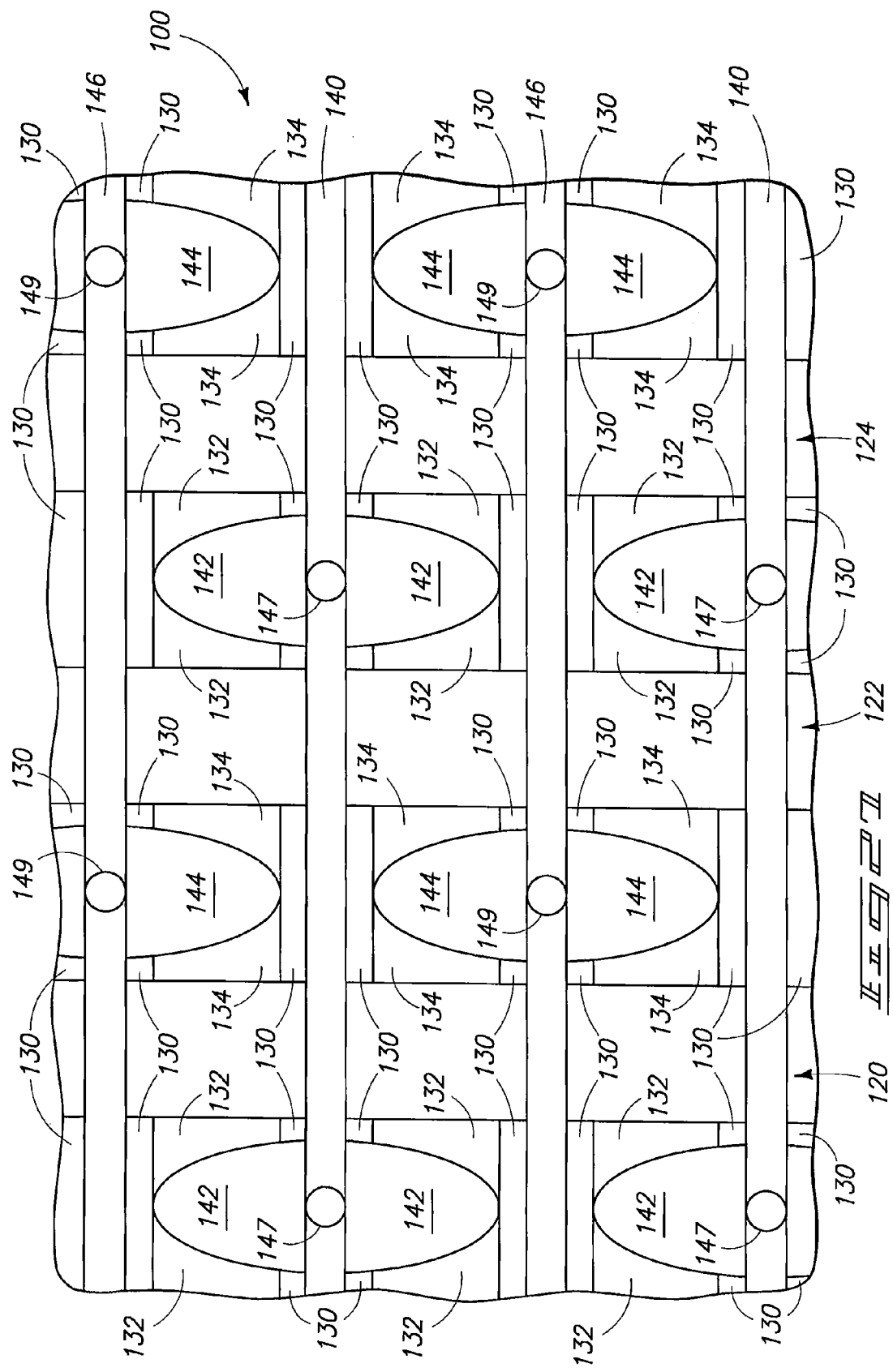

Referring to FIG. 17, openings 90 and 92 are extended into base 52 to form recesses within the base, and phase change material 12 is then deposited within the recesses. In the shown embodiment, the phase change material fills the recesses. The phase change material 12 forms a first programmable volume 91 within base 52 on one side of the gateline 80, and forms a second programmable volume 93 within base 52 on an opposing side of the gateline from the first programmable volume.

Referring to FIG. 18, patterned masking material 82 (FIG. 17) is removed. Subsequently, spacers 19 are formed along opposing sidewalls of gate stack 80, and then source/drain regions 20 and 22 are formed within base 52. The spacers 19 are directly over (i.e., are vertically aligned with) the first and second programmable volumes 91 and 93.

The construction of FIG. 18 comprises a memory cell 10 having a FET channel region 24 that extends across a pair of phase change regions. The construction of FIG. 18 may be utilized analogously to the construction of FIGS. 6-9 to store two bits of data.

Another example process which may be utilized to form a memory cell configured to store two bits of information is described with reference to FIGS. 19-22. In referring to FIGS. 19-22, similar numbering will be used as is used to describe FIGS. 10-15, where appropriate.

Figure 19:
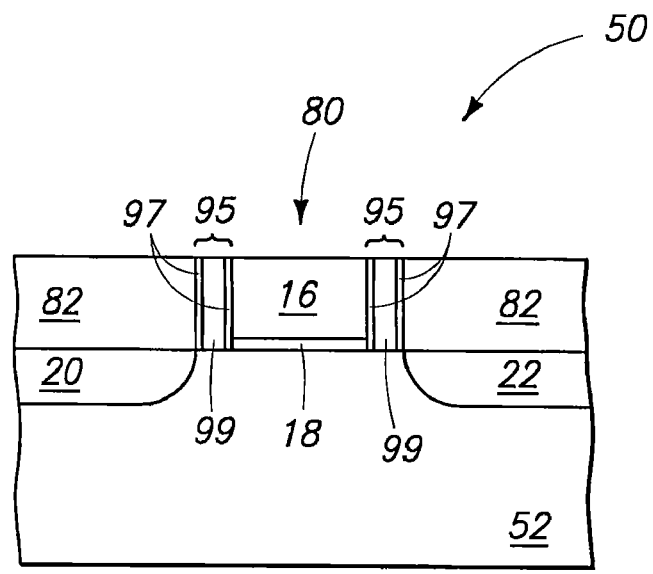
FIGS. 19-22 illustrate various processing stages for forming an embodiment of a memory device.

FIG. 19 shows construction 50 of FIG. 10 at a processing stage subsequent to that of FIG. 10. The construction comprises gateline 80 over base (or substrate) 52, and comprises source/drain regions 20 and 22 extending into base 52. The construction further comprises a pair of spacers 95 along opposing sidewalls of the gateline, and comprises dielectric material 82 over the base 52 beside the spacers. The spacers each include a material 99 vertically sandwiched between a pair of structures comprising a material 97. The material 99 is selectively removable relative to the material 97. For instance, in some embodiments one of the materials 97 and 99 may consist of silicon dioxide and the other may consist of silicon nitride. Material 99 may be referred to as a sacrificial material and material 97 may be referred to as non-sacrificial material. Dielectric material 82 may be a passivation for regions 20 and 22, and/or may be a sacrificial material.

Figure 20:
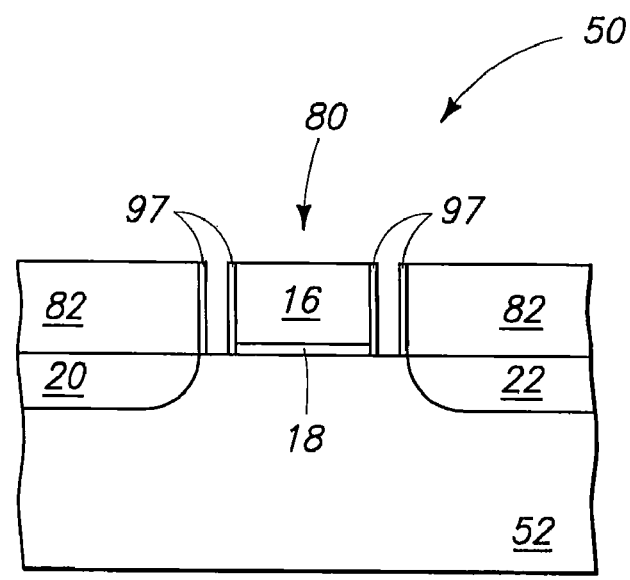

Referring to FIG. 20, sacrificial material 99 (FIG. 19) is selectively removed relative to non-sacrificial material 97 to form openings extending to base 52.

Figure 21:
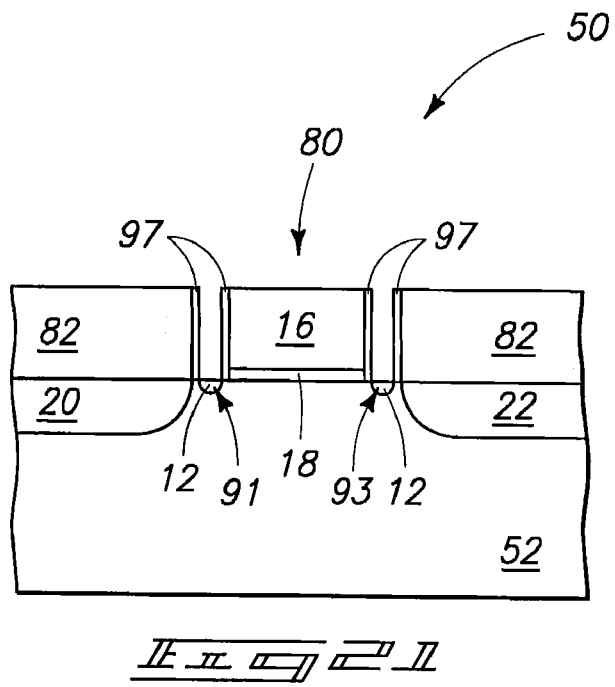

Referring to FIG. 21, an etch of base 52 is conducted through the openings to form recesses within the base 52; and phase change material 12 is then deposited within the recesses. The phase change material 12 forms a first programmable volume 91 within base 52 on one side of the gateline 80, and forms a second programmable volume 93 within base 52 on an opposing side of the gateline from the first programmable volume.

Figure 22:
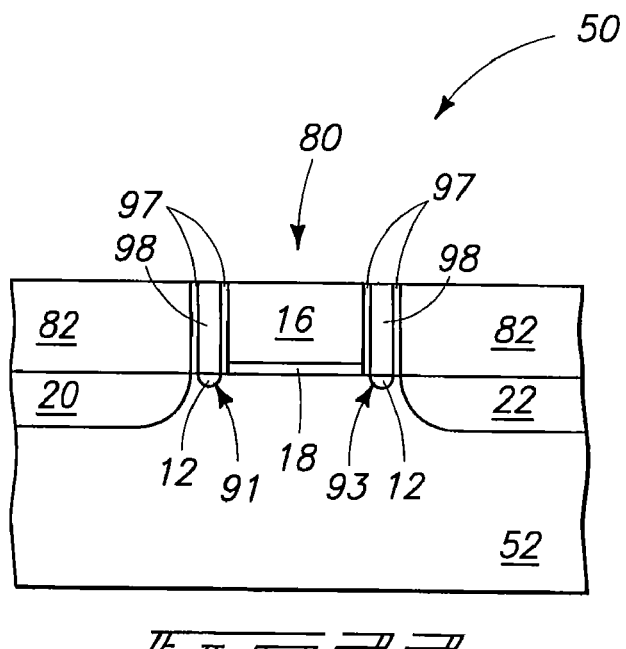

Referring to FIG. 22, spacer material 98 is formed over programmable volumes 91 and 93. In some embodiments, spacer material 98 may consist of phase change material 12 and may be formed at the processing stage of FIG. 21. Thus, phase change material 12 may be formed with the recess of FIG. 21, and then utilized to fill the openings between structures 97; and accordingly the structure 98 of FIG. 22 may be phase change material having the same composition as the material 12. In other embodiments, material 98 may be a material other than phase change material, and may thus have a different composition than material 12.

The embodiment of FIGS. 19-22 forms the source/drain regions 20 and 22 prior to forming programmable volumes 91 and 93. In other embodiments, the source/drain regions may be formed after forming the programmable volumes.

Figure 23:
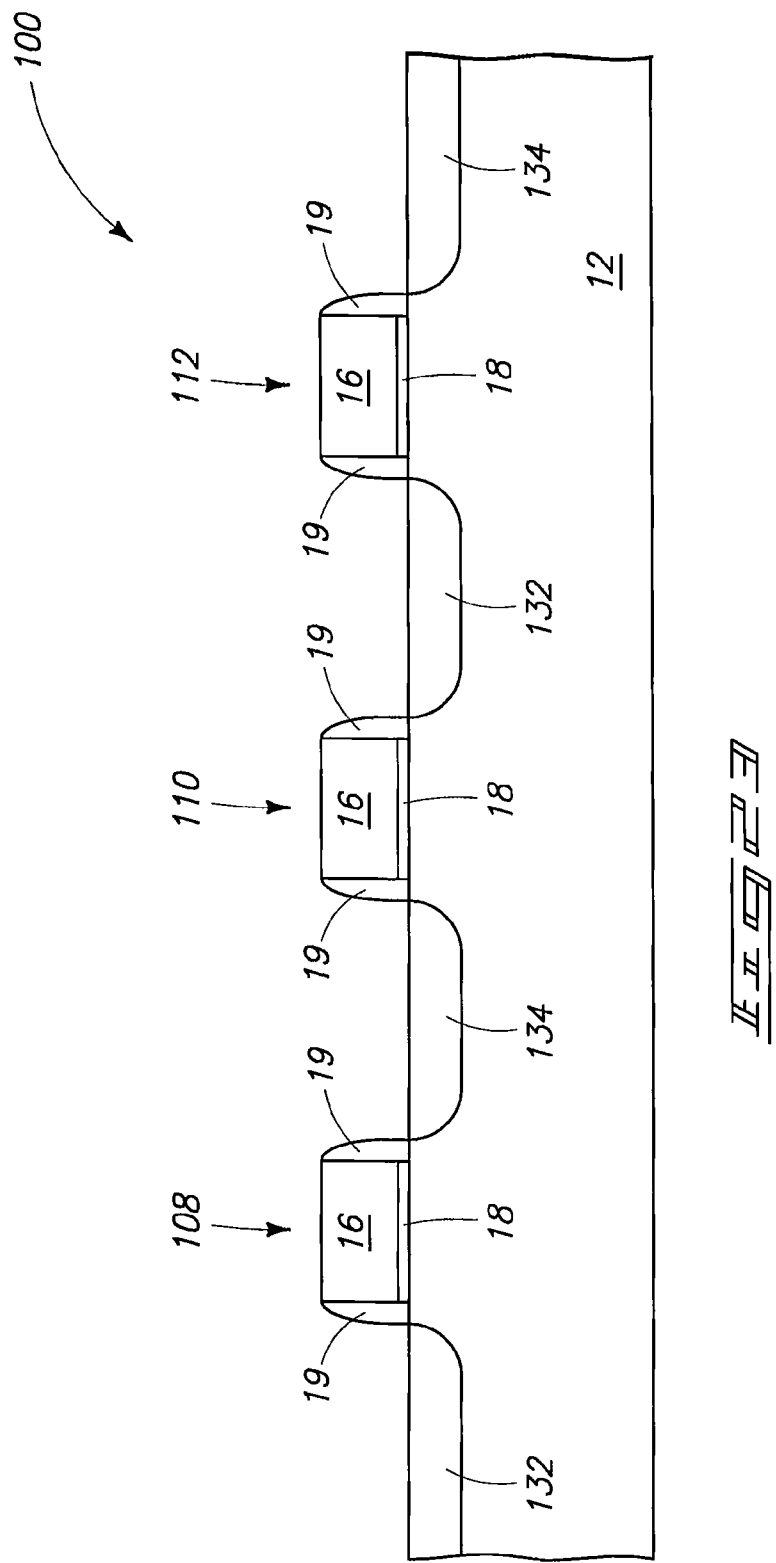
FIGS. 23 and 24 illustrate a cross-sectional view and top view, respectively, of a portion of a memory array at a processing stage in accordance with an embodiment.
Figure 24:
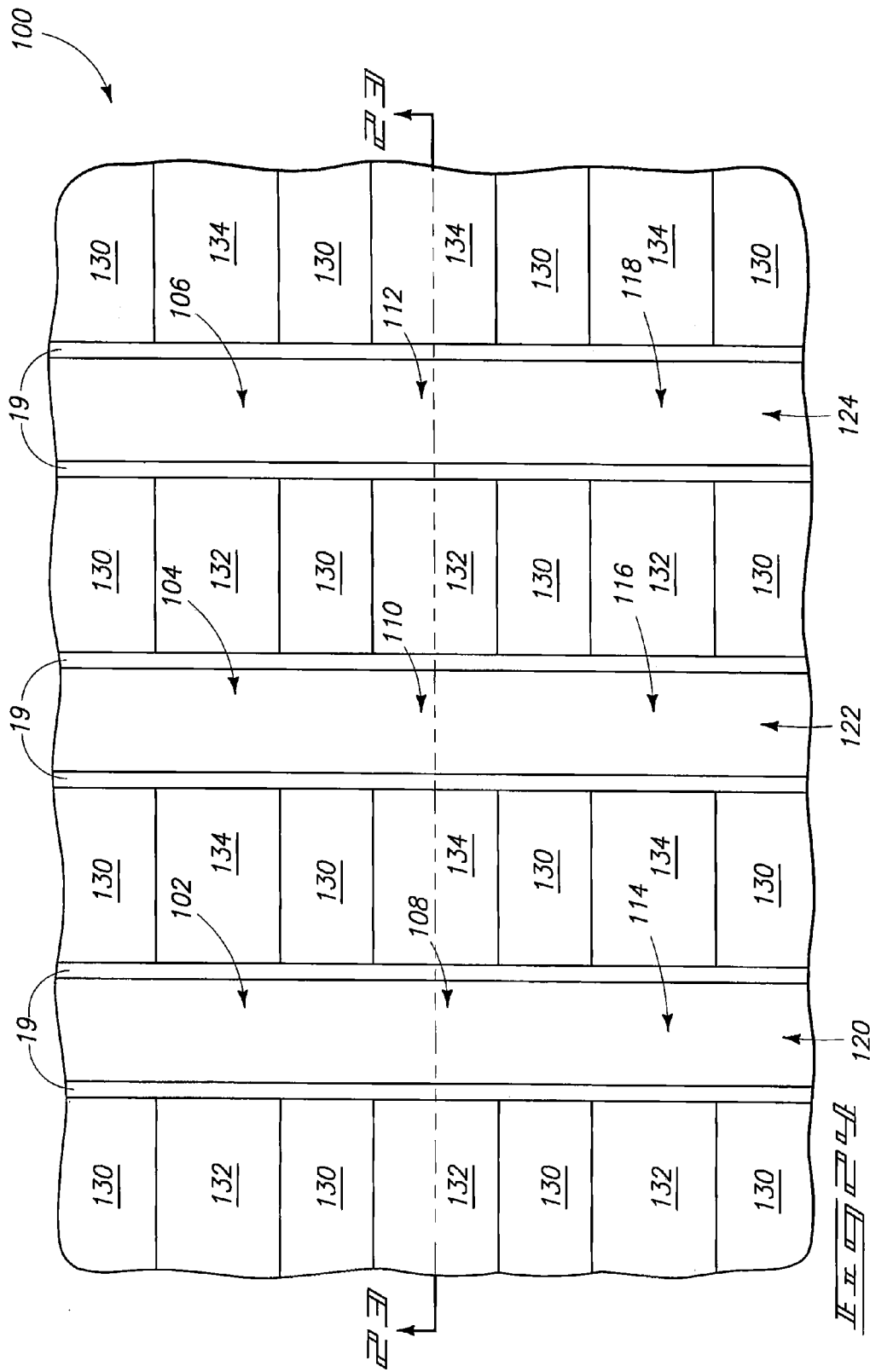

The memory cells described above may be incorporated into memory arrays. FIGS. 23 and 24 illustrate a cross-sectional side view and cross-sectional top view, respectively, of a portion of a memory array 100 comprising a plurality of memory cells of the type described in FIGS. 6-9. More specifically, the memory array comprises a plurality of memory cells 102, 104, 106, 108, 110, 112, 114, 116, and 118 formed across phase change material 12.

The memory cells are along gatelines 120, 122 and 124. The gatelines comprise stacks of gateline material 16 over dielectric material 18. Spacers 19 are shown extending along opposing sidewalls of the gatelines.

Source regions 132 and drain regions 134 are formed within phase change material 12 as part of memory cells 102, 104, 106, 108, 110, 112, 114, 116, and 118. The source regions will change to drain regions, and the drain regions to source regions, during programming of the memory cells (as discussed with reference to FIGS. 6-9). Accordingly, all of the regions 132 and 134 may be generically referred to as source/drain regions. However, there will be two distinct sets of regions at any programming stage, with one of the sets being source regions and the other being drain regions. Regions 132 are referred to as being source regions and regions 134 as drain regions to provide an example of one programming stage.

Each memory cell may comprise an area of $4F^2$, where "F" is a minimum feature size of a process utilized to form the memory cells.

The memory cell array 100 comprises columns and rows. The columns are along the gatelines (with an example column comprising the memory cells 102, 108, and 114 along gateline 120); and the rows extend substantially orthogonally to the columns (with an example row of memory cells corresponding to the memory cells 108, 110 and 112). Isolation material 130 is provided within phase change material 12 to electrically isolate memory cells of one row from the memory cells of adjacent row.

The construction of FIGS. 23 and 24 may be formed utilizing any suitable processing. In some embodiments, the construction may be formed by deposition of phase change material (for instance, p-type background doped GST or p-type background doped SeInSb) over a semiconductor substrate (for instance, a monocrystalline silicon wafer), followed by provision of isolation material 130 utilizing shallow trench isolation technologies. Gate dielectric 18 and gate material 16 may then be deposited, and subsequently patterned into the gatelines utilizing a dry etch. Spacers 19 may then be formed along sidewalls of the gatelines. Next, n-type dopant may be implanted to form the source/drain regions 132 and 134, and/or metal may be deposited to form Schottky barriers of the source/drain regions. Additionally, source/drain salicidation may be conducted. Further, low temperature backend processes may be utilized to provide additional integrated circuit connections, and/or to activate dopant.

Figure 25:
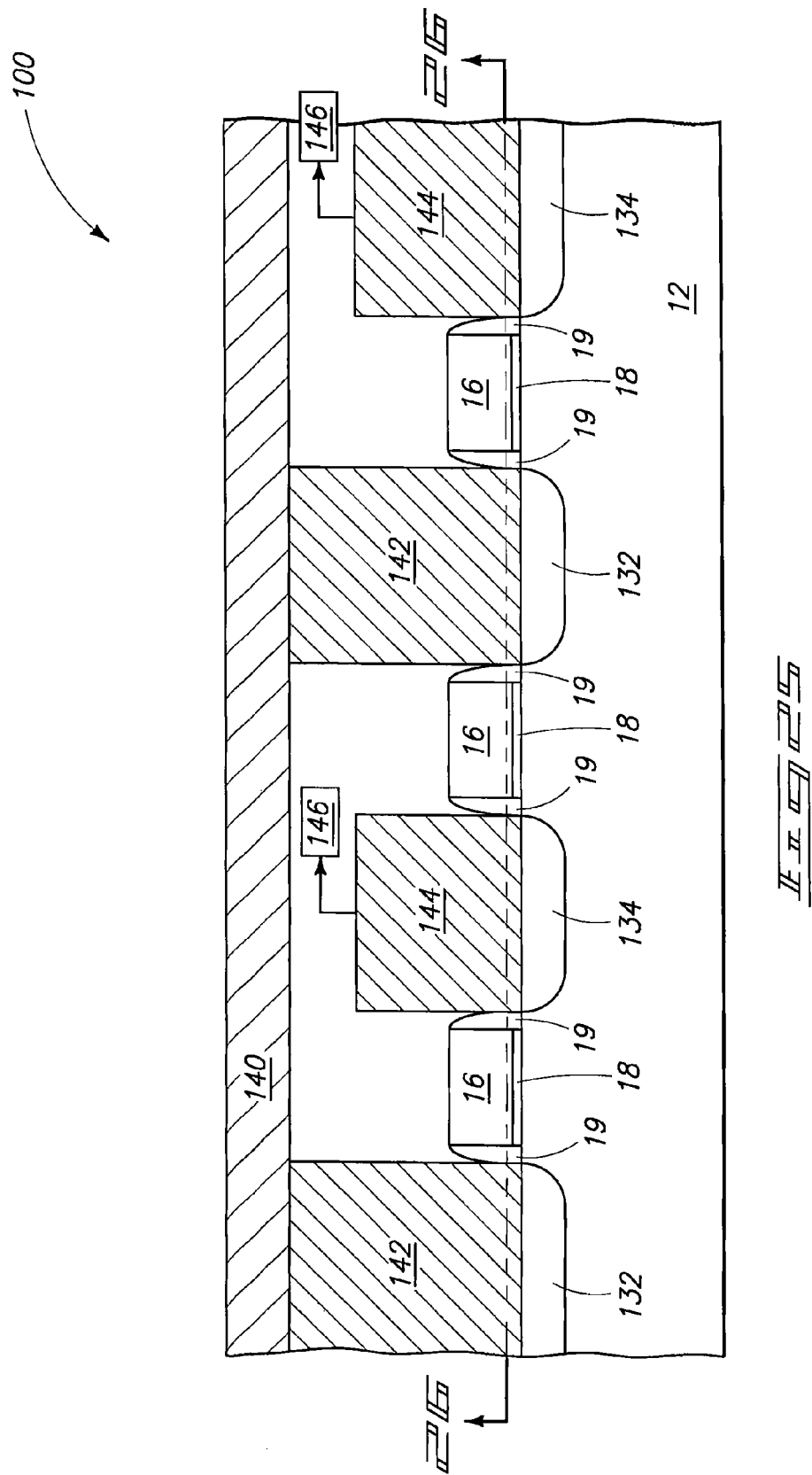

The memory array of FIGS. 23 and 24 may be electrically coupled to access lines extending across the array, as shown in FIGS. 25 and 26. More specifically, a first set of conductive pedestals 142 connect source regions 132 to a source interconnect line 140, and a second set of conductive pedestals 144 connect drain regions 134 to a drain interconnect line 146. The conductive pedestals 142 may be referred to as source interconnect pedestals, and the conductive pedestals 144 may be referred to as drain interconnect pedestals. Pedestals 142 and 144 may be fabricated at the same process step as one another. In some embodiments (not shown) pedestals 142 and 144 may be the same height as one another.

As discussed previously, the terms "source" and "drain" are relative to one another, and the regions corresponding to sources at the programming stage of FIGS. 25 and 26 may correspond to drains at a different programming stage.

The source and drain interconnect lines are not shown in FIG. 26, but rather the cross-section is taken through a location which illustrates an example shape for the source interconnect pedestals 142 and the drain interconnect pedestals 144. Specifically, individual source interconnect pedestals 142 may extend across a pair of source regions from adjacent rows, and similarly individual drain interconnect pedestals 144 may extend across a pair of drain regions from adjacent rows. Interconnection of the source interconnect pedestals to underlying source regions is diagrammatically illustrated by dashed-line interconnect regions 143, and interconnection of the drain interconnect pedestals to underlying drain regions is diagrammatically illustrated by dashed-line interconnect regions 145.

The source interconnect pedestals are each shared by two source regions, and similarly the drain interconnect pedestals are each shared by two drain regions. The utilization of shared source interconnect pedestals and shared drain interconnect pedestals may enable high integration in some embodiments.

FIG. 27 is a view of the plan layout of FIG. 26 from an elevation above the source lines 140 and drain lines 146. Such shows the source lines 140 and drain lines 146 extending parallel to one another across the array, and orthogonally to the gatelines 120, 122 and 124. Electrical connections from the source interconnect pedestals 142 to the source lines 140 are diagrammatically illustrated by locations 147; and similarly electrical connections from the drain interconnect pedestals 144 to the drain lines 146 are diagrammatically illustrated by locations 149. The spacers 19 (FIG. 26) are not shown in FIG. 27 to simplify the drawing.

The plan layout of FIG. 27 utilizes electrical flow through three different lines to uniquely identify each memory cell of the array. Specifically, a source interconnect line, drain interconnect line, and gateline are all utilized to uniquely identify a memory cell. The layout thus utilizes one additional line for unique identification of the memory cells than is utilized in traditional DRAM (in which a bitline and wordline are used for unique identification of a memory cell).

FIG. 28 is a top view of another plan layout for accessing memory cells of the types described in FIGS. 1-9. Identical numbering is utilized to describe FIG. 28 as is used to describe FIGS. 25-27.

The plan layout of FIG. 28 shows the source and drain lines 140 and 146 zigzagging across the array of memory cells; and illustrates locations 143 and 145 where the source lines and drain lines, respectively, connect with source and drain regions, respectively. The layout of FIG. 28 may alleviate utilization of pedestals connecting adjacent drain regions or source regions to one another, relative to the layout of FIG. 27. However, the layout of FIG. 28 still utilizes electrical flow through all of a source interconnect line, a drain interconnect line, and a gateline to uniquely identify a memory cell.

Figure 29:
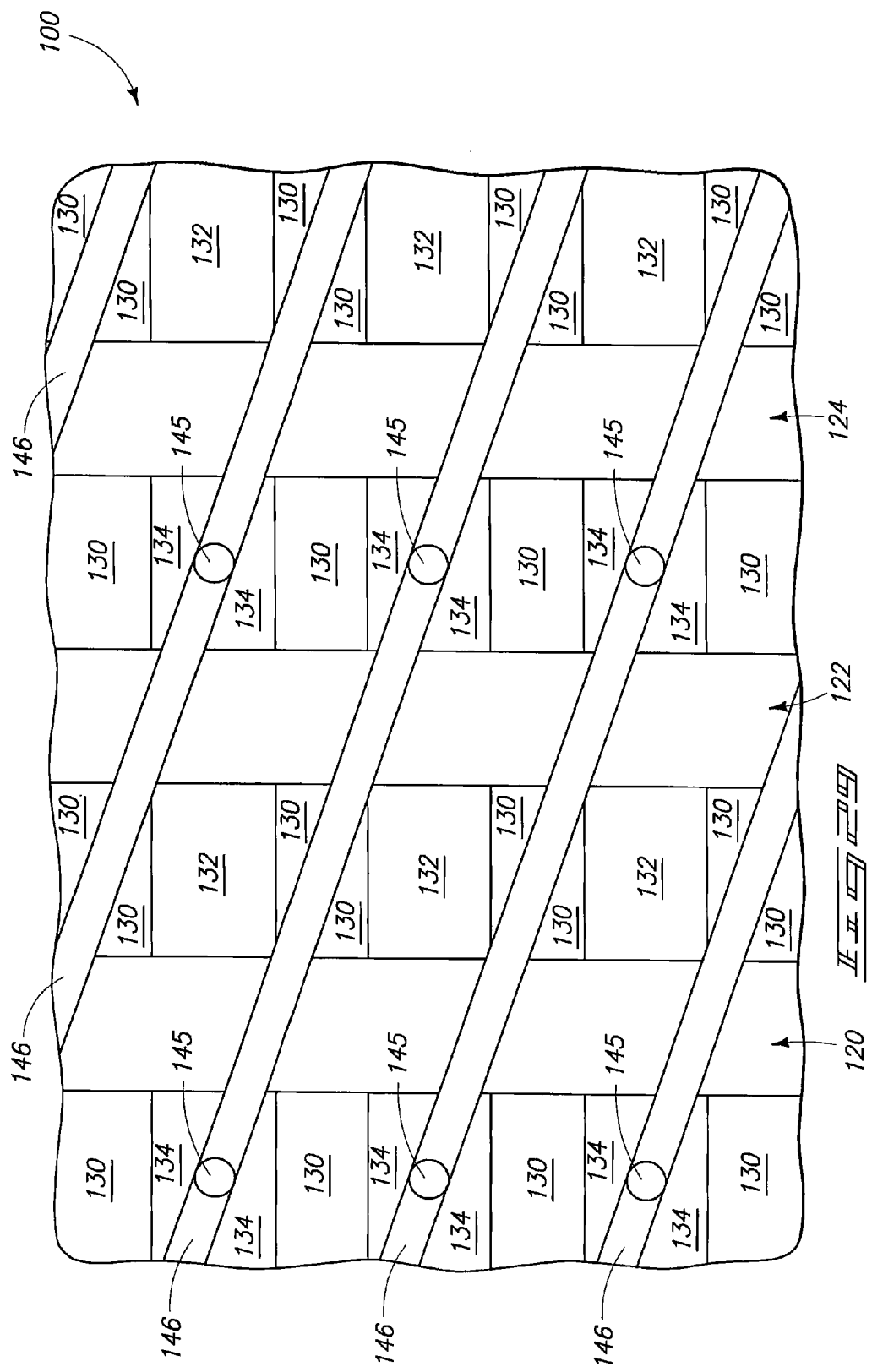

FIG. 29 is a top view of another plan layout for accessing memory cells of the types described in FIGS. 1-9. Identical numbering is utilized to describe FIG. 29 as is used to describe FIGS. 25-27.

The plan layout of FIG. 29 shows the drain lines 146 extending diagonally across the array of memory cells, and illustrates locations 145 where the drain lines connect with the drain regions 134. No source interconnect lines are shown in the layout of FIG. 29 because all of the source regions are electrically grounded (or biased to a constant voltage). Such grounding (or constant voltage biasing) may occur through lines extending between and parallel to the drain lines (not shown), or through connections under the source regions. The layout of FIG. 29 may utilize electrical flow through only two lines (specifically, a drain interconnect line and a gateline) to uniquely identify a memory cell.

Figure 30:
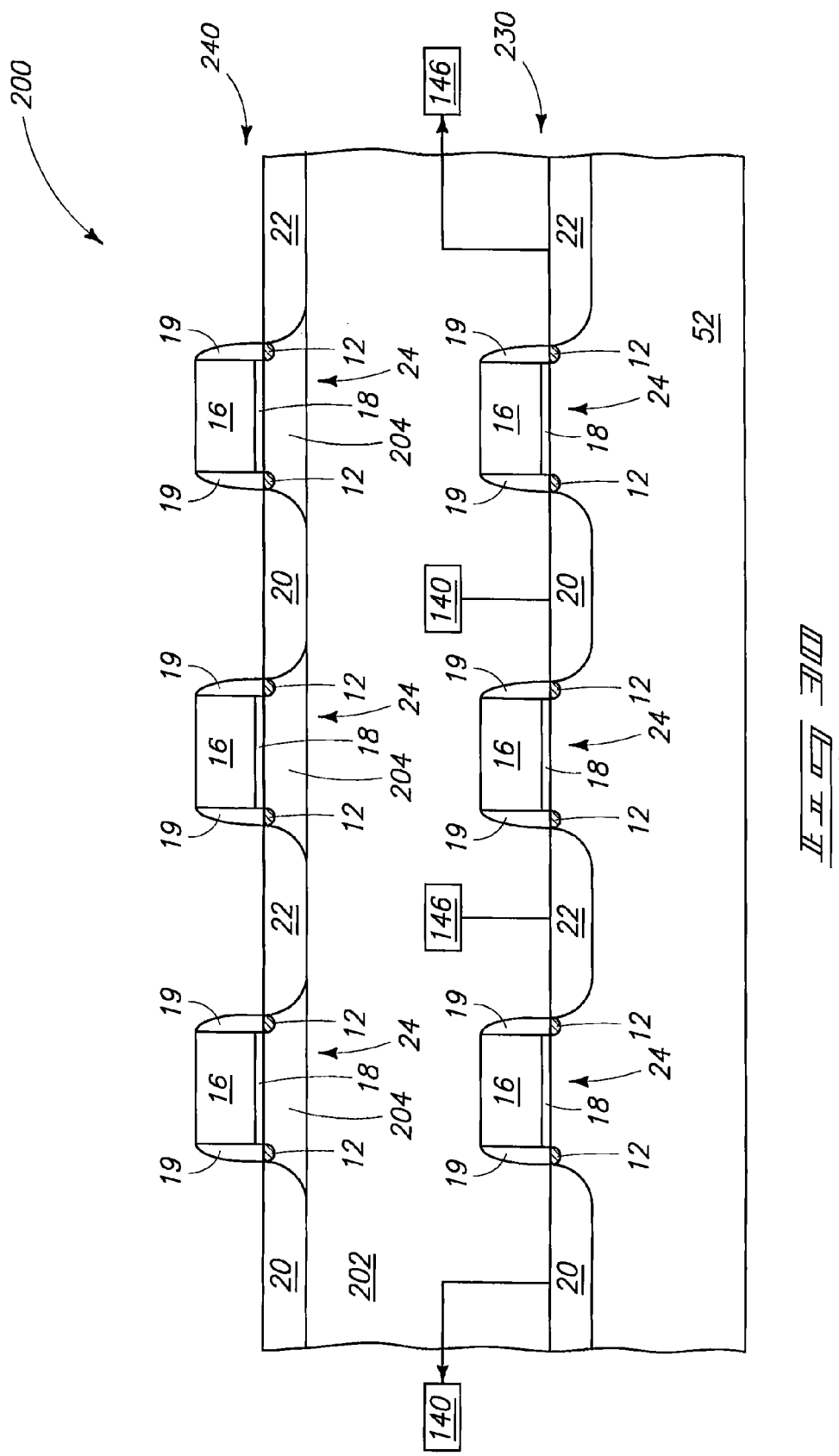
FIG. 30 is a diagrammatic, cross sectional view of a portion of a semiconductor construction illustrating an example embodiment stacking arrangement of memory device arrays.

An advantage of the memory cell constructions utilizing phase change material in the channel regions of FETs is that the memory cells may be incorporated into three-dimensional arrangements of stacked memory arrays. FIG. 30 shows a construction 200 comprising an example stacked configuration of a pair of memory arrays 230 and 240. FIG. 30 will be described utilizing the same numbering as is used above to describe various of FIGS. 1-29, where appropriate.

The lower memory array 230 is formed over a semiconductor base 52. The lower memory array comprises a plurality of FETs that contain phase change material 12 within their channel regions 24. The FETs are shown to comprise source regions 20 and drain regions 22, which are connected to source interconnect lines 140 and drain interconnect lines 146, respectively.

An electrically insulative material 202 is formed over the first memory array. Electrically insulative material 202 may comprise any suitable composition or combination compositions; and may, for example, comprise, consist essentially of, or consist of silicon dioxide.

The second memory array 240 is formed over insulative material 202. More specifically, a semiconductor base material 204 is formed, phase change material 12 is formed within the base material, and the FETS of memory array 240 are formed to comprise the phase change material within channel regions 24. The sources 20 and drains 22 of the second memory array 240 may be connected to source interconnect lines (not shown) and drain interconnect lines (not shown) analogous to the lines 140 and 146.

Among the advantages of some of the embodiments of PCRAM constructions provided herein relative to conventional PCRAM constructions are that the embedding of data storage capability in PCRAM transistors may eliminate process steps relative to conventional processing. Also, some of the PCRAM embodiments disclosed herein may be highly scalable. Channel current density is utilized to determine self-heating near a drain, and such may be conducted regardless of the channel width of a FET. Additionally, some of the PCRAM embodiments disclosed herein may be nonvolatile, and may have low power consumption. The programming may be conducted utilizing self-heating, which may eliminate a heater utilized in some conventional PCRAM constructions. The hot electron-hole pairs may not only create the heat utilized for programming, but may also reduce melting temperature and crystallization temperature of phase change material. The reduced melting and crystallization temperatures provide synergistic effects to the utilization of hot carriers for programming, and such synergistic effects may be taken advantage of in some embodiments disclosed herein. The continuous parallel active area stripes of, for example, the construction of FIGS. 23 and 24 may simplify photo patterning and dry etching relative to other layouts. Additionally, the formation of isolation material along parallel lines may simplify formation of the isolation material relative to other layouts.

The memory cells and memory cell arrays discussed above may be incorporated into electronic systems, such as computer systems, car electrical systems, cellular phones, cameras, etc.

Figure 31:
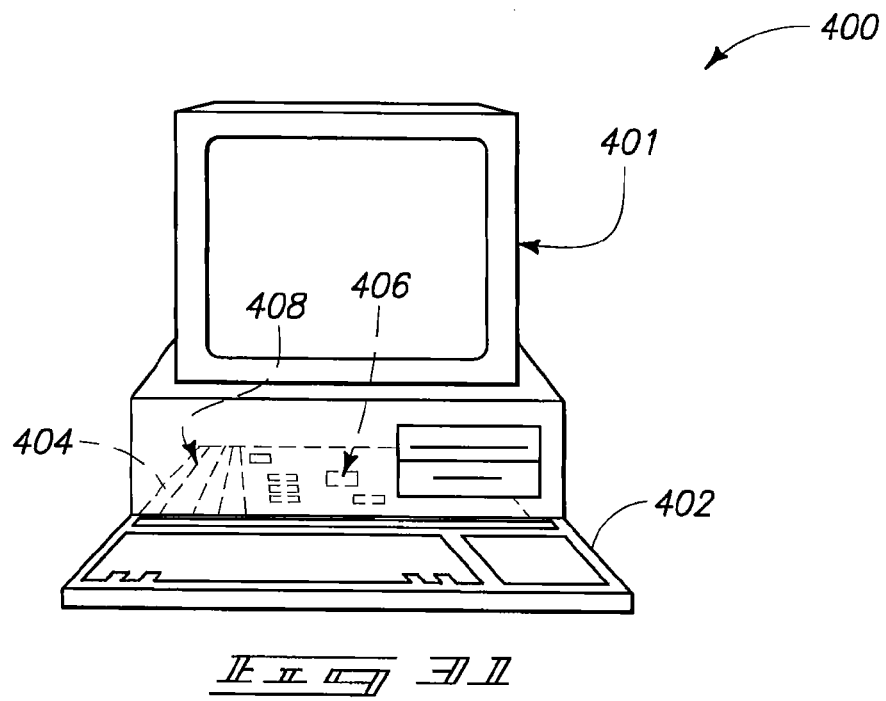
FIG. 31 is a diagrammatic view of a computer embodiment.
Figure 32:
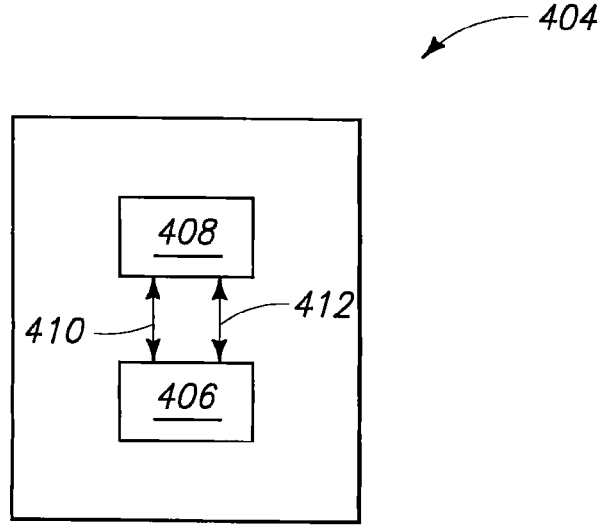
FIG. 32 is a block diagram showing particular features of the motherboard of the FIG. 31 computer embodiment.

FIG. 31 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 32. In such block diagram, the addressing circuitry is illustrated as 410 and the read circuitry is illustrated as 412.

Processor device 406 may correspond to a processor module, and associated memory utilized with the module may comprise PCRAM.

Memory device 408 may correspond to a memory module, and may comprise PCRAM.

Figure 33:
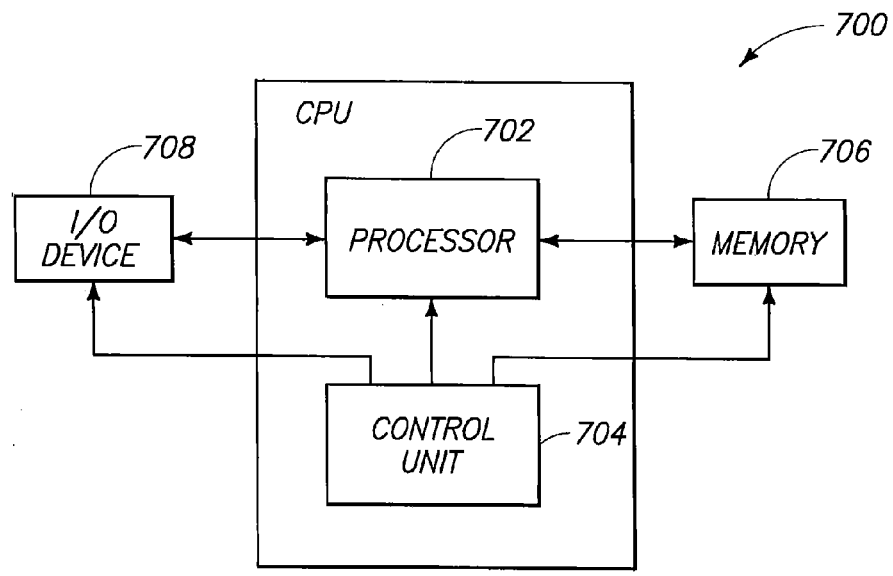
FIG. 33 is a high level block diagram of an electronic system embodiment.

FIG. 33 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include PCRAM.

Figure 34:
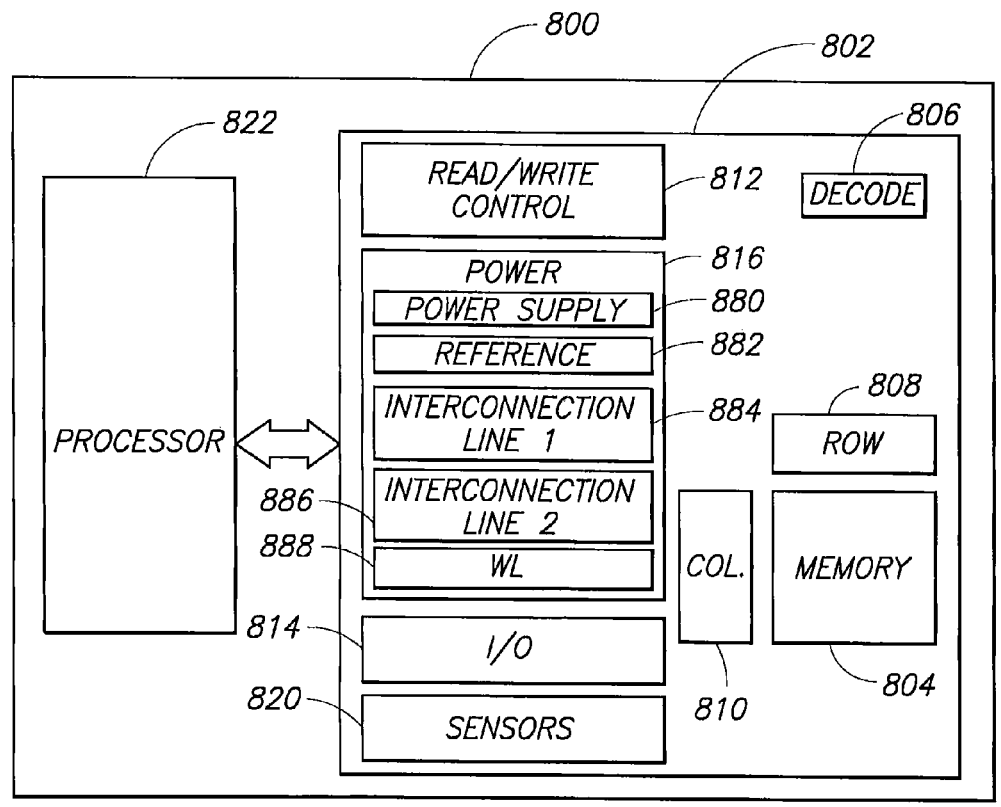
FIG. 34 is a simplified block diagram of a memory device embodiment.

FIG. 34 is a simplified block diagram of an electronic system 800. The system 800 includes a memory device 802 that has an array of memory cells 804, address decoder 806, row access circuitry 808, column access circuitry 810, read/ write control circuitry 812 for controlling operations, and input/output circuitry 814. The memory device 802 further includes power circuitry 816, and sensors 820, such as current sensors for determining whether a memory cell is in a low-resistivity conducting state or in a high-resistivity less-conducting state. The illustrated power circuitry 816 includes power supply circuitry 880, circuitry 882 for providing a reference voltage, circuitry 884 for providing a first source/drain interconnection line with pulses, circuitry 886 for providing a second source/drain interconnection line with pulses, and circuitry 888 for providing a wordline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include PCRAM.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of programming a memory cell, the memory cell comprising a transistor which includes a transistor gate spaced from a channel region by at least a gate dielectric, which includes a first source/drain region adjacent one side of the channel region, and which includes a second source/drain region adjacent an opposing side of the channel region from the first source/drain region;
   wherein the channel region comprises phase change material regions adjacent the first and second source/drain regions and comprises non-phase change material between the phase change material regions, the method comprising:
   utilizing the first source/drain region as a source and the second source/drain region as a drain to induce one memory state of the memory cell;
   utilizing the second source/drain region as a source and the first source/drain region as a drain to induce another memory state of the memory cell; and
   wherein the memory cell is supported by a monocrystalline silicon base.

2. A method of programming a memory cell, the memory cell comprising a transistor which includes a transistor gate spaced from a channel region by at least a gate dielectric, which includes a source region adjacent one side of the channel region, and which includes a drain region adjacent an opposing side of the channel region from the source region; wherein the channel region comprises phase change material adjacent at least the drain region, the method comprising:
   forming an inversion layer within the channel region adjacent the gate dielectric, the inversion layer having a pinch-off region within the phase change material adjacent the drain region;
   utilizing hot carriers within the pinch-off region to change a phase of the phase change material;
   wherein the channel region comprises non-phase change material; and
   wherein the memory cell is supported by a monocrystalline silicon base.

3. The method of claim 2 wherein the change in phase decreases crystallinity of the phase change material.

4. The method of claim 2 wherein the change in phase increases crystallinity of the phase change material.

5. The method of claim 2 wherein the hot carriers are electrons.

6. The method of claim 2 wherein the hot carriers are holes.

7. The method of claim 2 wherein the channel region primarily comprises non-phase change semiconductor material, and comprises the phase change material only adjacent the drain region.

8. The method of claim 7 wherein the non-phase change semiconductor material of the channel region comprises monocrystalline silicon.

9. A method of forming a programmed memory cell, comprising:
   forming a transistor which includes a channel region between first and second source/drain regions; the channel region being supported by a silicon-containing substrate; the channel region comprising a first volume of programmable material adjacent the first source/drain region, comprising a second volume of programmable material adjacent the second source/drain region, and comprising non-phase change material between the first and second volumes;
   forming a first inversion layer within the channel region, the first inversion layer having a first pinch-off region within the first volume of programmable material;
   utilizing hot carriers within the first pinch-off region to change a phase within the first volume of programmable material and thereby achieve a first memory state;
   forming a second inversion layer within the channel region, the second inversion layer having a second pinch-off region within the second volume of programmable material; and
   utilizing hot carriers within the second pinch-off region to change a phase within the second volume of programmable material and thereby achieve a second memory state.

* * * * *